United States Patent
Kato

(10) Patent No.: US 10,541,341 B2
(45) Date of Patent: Jan. 21, 2020

(54) SEMICONDUCTOR LIGHT RECEIVING DEVICE HAVING A TYPE—II SUPERLATTICE

(71) Applicant: SUMITOMO ELECTRIC INDUSTRIES, LTD., Osaka (JP)

(72) Inventor: Takashi Kato, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/991,692

(22) Filed: May 29, 2018

(65) Prior Publication Data

US 2018/0358489 A1 Dec. 13, 2018

(30) Foreign Application Priority Data

Jun. 8, 2017 (JP) ................................. 2017-113778
Apr. 27, 2018 (JP) ................................. 2018-087402

(51) Int. Cl.
*H01L 31/0352* (2006.01)
*H01L 31/02* (2006.01)
(Continued)

(52) U.S. Cl.
CPC ............... *H01L 31/035236* (2013.01); *H01L 31/022408* (2013.01); *H01L 31/0304* (2013.01);
(Continued)

(58) Field of Classification Search
CPC ..... H01L 31/035236; H01L 31/022408; H01L 31/03042; H01L 31/03046; H01L 31/05; H01L 31/105
See application file for complete search history.

(56) References Cited

U.S. PATENT DOCUMENTS 6,133,593 A * 10/2000 Boos ................... H01L 29/1029
257/194
7,692,183 B2 * 4/2010 Razeghi .............. H01L 31/0304
257/28
(Continued)

OTHER PUBLICATIONS

Grein, C. H., et al., "Modeling of Very Long Infrared Wavelength InAs/GaInSb Strained Layer Superlattice Detectors", Materials for Infrared Detectors II, Proceedings of SPIE, vol. 4795, p. 39-p. 43 (2002).

*Primary Examiner* — Ida M Soward
(74) *Attorney, Agent, or Firm* — Smith, Gambrell & Russell, LLP.

(57) ABSTRACT

A light receiving device includes a light absorbing layer. The light absorbing layer includes multiple unit structures. Each unit structure has an InAs portion, a first GaSb portion, an InSb portion, and a second GaSb portion, which are arranged in a direction of an axis. One of the group-III atomic plane and the group-V atomic plane in the first GaSb portion is bonded to another of the group-III atomic plane and the group-V atomic plane in the InAs portion. One of the group-III atomic plane and the group-V atomic plane of the InSb portion is bonded to another of the group-III atomic plane and the group-V atomic plane of the first GaSb portion. One of the group-III atomic plane and the group-V atomic plane of the second GaSb portion is bonded to another of the group-III atomic plane and the group-V atomic plane of the InSb portion.

5 Claims, 20 Drawing Sheets

(51) Int. Cl.
  *H01L 31/0304* (2006.01)
  *H01L 31/10* (2006.01)
  *H01L 31/105* (2006.01)
  *H01L 31/0224* (2006.01)
  *H01L 31/109* (2006.01)
  *B82Y 20/00* (2011.01)

(52) U.S. Cl.
  CPC .. *H01L 31/03042* (2013.01); *H01L 31/03046* (2013.01); *H01L 31/105* (2013.01); *H01L 31/109* (2013.01); *B82Y 20/00* (2013.01)

(56) References Cited

U.S. PATENT DOCUMENTS

| | | | |
|---|---|---|---|
| 9,064,992 B1* | 6/2015 | Nosho | H01L 31/02016 |
| 9,105,804 B2* | 8/2015 | Iguchi | H01L 31/184 |
| 9,608,148 B2* | 3/2017 | Kyono | H01L 31/035236 |
| 2010/0301216 A1* | 12/2010 | Vardi | B82Y 20/00 |
| | | | 250/338.4 |
| 2011/0210313 A1* | 9/2011 | Fujii | B82Y 20/00 |
| | | | 257/21 |
| 2014/0374701 A1* | 12/2014 | Wei | H01L 31/03046 |
| | | | 257/18 |
| 2015/0053261 A1* | 2/2015 | Tsuchiya | H01L 31/035254 |
| | | | 136/256 |
| 2015/0115222 A1* | 4/2015 | Kyono | H01L 31/035236 |
| | | | 257/21 |
| 2017/0170347 A1* | 6/2017 | Miura | H01L 31/035236 |
| 2017/0345958 A1* | 11/2017 | Meyer | H01L 31/02161 |
| 2017/0373206 A1* | 12/2017 | Knorr, Jr. | H01L 31/035236 |
| 2018/0069080 A1* | 3/2018 | He | H01L 29/157 |
| 2019/0088817 A1* | 3/2019 | Atanackovic | H01L 33/325 |

* cited by examiner

SEMICONDUCTOR LIGHT RECEIVING DEVICE HAVING A TYPE—II SUPERLATTICE

BACKGROUND OF THE INVENTION

Field of the Invention

The present invention relates to a semiconductor light receiving device. This application claims the benefit of priorities from Japanese Patent application No. 2017-113778 filed on Jun. 8, 2017, and Japanese Patent application No. 2018-087402 filed on Apr. 27, 2018, which are herein incorporated by reference in their entirety.

Related Background Art

C. H. Grein et. Al., "Modeling of Very Long Infrared Wavelength InAs/GaInSb Strained Layer Superlattice Detectors", Proceedings of SPIE Vol. 4795, Materials for Infrared Detectors II, 39 (2002) discloses a photodiode.

SUMMARY OF THE INVENTION

A light receiving device according to one aspect of the present invention includes: a first conductivity-type III-V compound semiconductor layer; a second conductivity-type III-V compound semiconductor layer; and a light absorbing layer disposed between the first conductivity-type III-V compound semiconductor layer and the second conductivity-type III-V compound semiconductor layer, the light absorbing layer including multiple unit structures arranged in a direction of an axis to form a type-II superlattice. Each unit structure has an InAs portion, a first GaSb portion, an InSb portion, and a second GaSb portion arranged in the direction of the axis. The InAs portion has multiple InAs molecular layers arranged in the direction of the axis. The first GaSb portion has a GaSb molecular layer, and the first GaSb portion has a group-III atomic plane and a group-V atomic plane. The InAs portion has a group-III atomic plane and a group-V atomic plane. One of the group-III atomic plane and the group-V atomic plane in the first GaSb portion id bonded to another of the group-III atomic plane and the group-V atomic plane in the InAs portion. The InSb portion has an InSb molecular layer. The InSb portion has a group-III atomic plane and a group-V atomic plane, and the InSb portion has a group-III atomic plane and a group-V atomic plane. One of the group-III atomic plane and the group-V atomic plane in the InSb portion is bonded to another of the group-III atomic plane and the group-V atomic plane in the first GaSb portion. The second GaSb portion has a GaSb molecular layer, and the second GaSb portion has a group-III atomic plane and a group-V atomic plane. One of the group-III atomic plane and the group-V atomic plane in the second GaSb portion is bonded to another of the group-III atomic plane and the group-V atomic plane in the InSb portion.

A light receiving device according to one aspect of the present invention includes: a first conductivity-type III-V compound semiconductor layer; a second conductivity-type III-V compound semiconductor layer; and a light absorbing layer disposed between the first conductivity-type III-V compound semiconductor layer and the second conductivity-type III-V compound semiconductor layer, the light absorbing layer including multiple unit structures arranged in a direction of an axis to form a type-II superlattice. Each unit structure includes one or more first molecular layers of InAs, one or more second molecular layers of GaSb, one or more third molecular layers of InSb, and one or more fourth molecular layers of GaSb. The unit structure includes the one or more first molecular layers, the one or more second molecular layers, the one or more third molecular layers, and the one or more fourth molecular layers.

A light receiving device according to one aspect of the present invention includes: a first conductivity-type III-V compound semiconductor layer; a second conductivity-type III-V compound semiconductor layer; and a light absorbing layer disposed between the first conductivity-type III-V compound semiconductor layer and the second conductivity-type III-V compound semiconductor layer, the light absorbing layer including multiple unit structures arranged in a direction of an axis to form a type-II superlattice. Each unit structure includes a single first group containing one or more InAs molecular layers, a single second group containing one or more GaSb molecular layers, one or more third groups containing one or more GaSb molecular layers, and one or more fourth groups containing one or more InSb molecular layers. In each unit structure, any of the third groups is disposed between the single second group and one of one or more fourth groups, and in the light absorbing layer, the single second group is disposed between the single first group and all the third groups.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DESCRIPTION OF THE EMBODIMENTS

Figure 1:
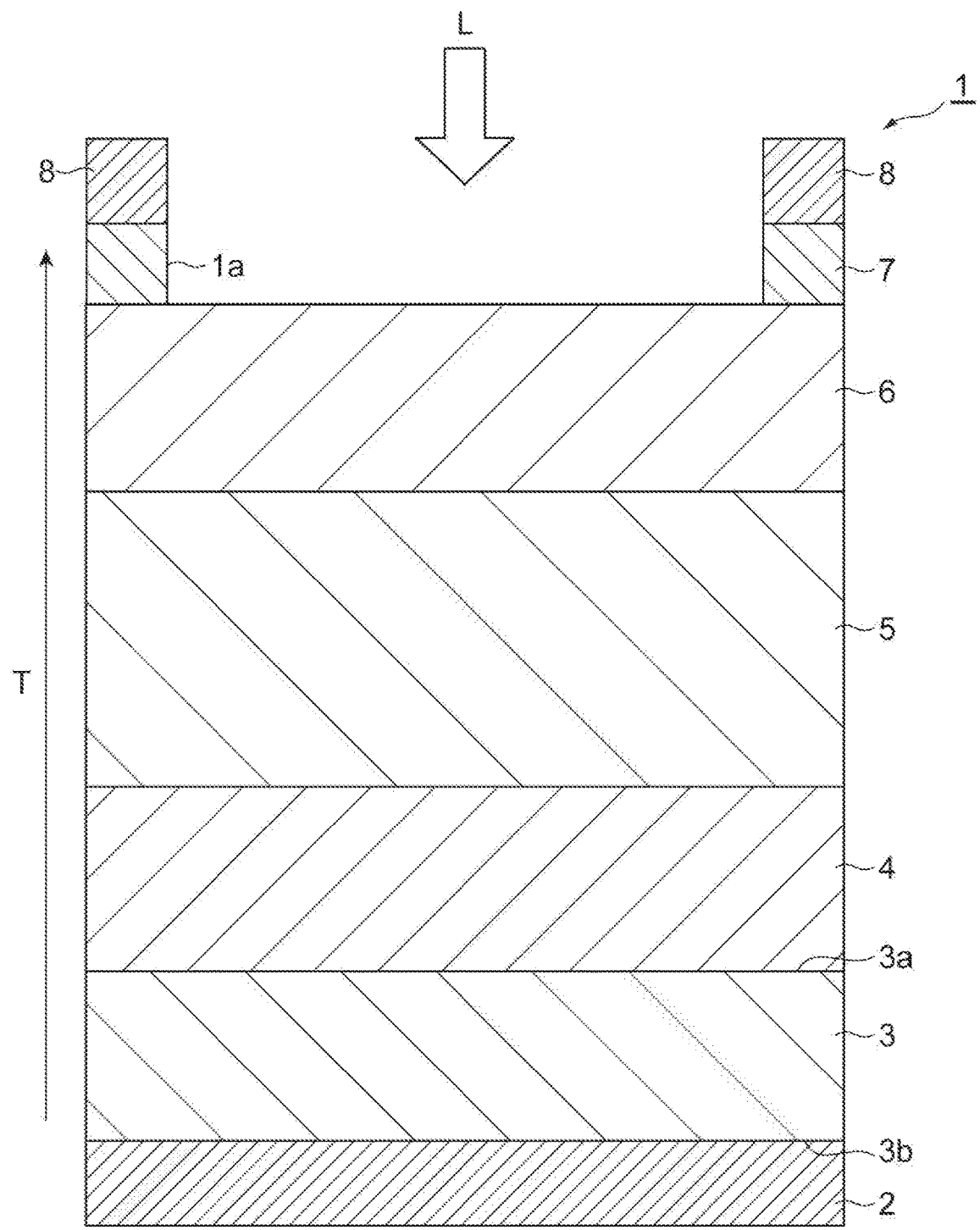
FIG. 1 is a schematic view showing a semiconductor light receiving device according to the present embodiment.

A photodiode having an InAs/GaSb superlattice structure exhibits a low light sensitivity in long infrared wavelengths, such as an absorption wavelength of 15 micrometers. What is desired is to makes the light receiving sensitivity better in the long infrared wavelengths.

It is an object according to one aspect of the present invention to provide a semiconductor light receiving device enabling improvement of a light sensitivity in the long-wavelength infrared region.

Embodiments according to the present above aspects are described below.

A light receiving device according to an embodiment includes: (a) a first conductivity-type III-V compound semiconductor layer; (b) a second conductivity-type III-V compound semiconductor layer; and (c) a light absorbing layer disposed between the first conductivity-type III-V compound semiconductor layer and the second conductivity-type III-V compound semiconductor layer, the light absorbing layer including multiple unit structures arranged in a direction of an axis to form a type-II superlattice. Each unit structure has an InAs portion, a first GaSb portion, an InSb portion, and a second GaSb portion arranged in the direction of the axis. The InAs portion has multiple InAs molecular layers arranged in the direction of the axis. The first GaSb portion has a GaSb molecular layer, and the first GaSb portion has a group-III atomic plane and a group-V atomic plane. The InAs portion has a group-III atomic plane and a group-V atomic plane. One of the group-III atomic plane and the group-V atomic plane in the first GaSb portion is bonded to another of the group-III atomic plane and the group-V atomic plane in the InAs portion. The InSb portion has an InSb molecular layer. The InSb portion has a group-III atomic plane and a group-V atomic plane, and the InSb portion has a group-III atomic plane and a group-V atomic plane. One of the group-III atomic plane and the group-V atomic plane in the first portion is bonded to another of the group-III atomic plane and the group-V atomic plane in the first GaSb portion. The second GaSb portion has a GaSb molecular layer, and the second GaSb portion has a group-III atomic plane and a group-V atomic plane. One of the group-III atomic plane and the group-V atomic plane in the second GaSb portion is bonded to another of the group-III atomic plane and the group-V atomic plane in the InSb portion.

The semiconductor light receiving device allows each unit structure to have the InSb portion between the first GaSb portion and the second GaSb portion, and the InSb portion is spaced from the InAs portion. The addition of the InSb portion to a unit structure can provide the InAs portion with the reduced number of InAs molecular layers enabling a desired long-wavelength absorption edge.

In the light receiving device according to an embodiment, the first GaSb portion has a group-V atomic plane bonded to a group-III atomic plane of the InAs portion; the InSb portion has a group-V atomic plane bonded to a group-III atomic plane of the first GaSb portion; and the second GaSb portion has a group-V atomic plane bonded to a group-III atomic plane of the InSb portion.

The semiconductor light receiving device provides the unit structure with molecular layers arranged such that a group-V atomic plane of the GaSb molecular layers is bonded to a group-III atomic plane of the InAs molecular layers.

In the light receiving device according to an embodiment, the first GaSb portion has a group-III atomic plane bonded to a group-V atomic plane of the InAs portion; the InSb portion has a group-III atomic plane bonded to a group-V atomic plane of the first GaSb portion; and the second GaSb portion has a group-III atomic plane bonded to a group-V atomic plane of the InSb portion.

The semiconductor light receiving device provides the unit structure with molecular layers arranged such that a group-III atomic plane of GaSb molecular layers is bonded to a group-V atomic plane of InAs molecular layers.

In the light receiving device according to an embodiment, the first GaSb portion has a number of group-III atomic layers different from that of the second GaSb portion.

In the semiconductor light receiving device, the unit structure allows the first GaSb portion to have the number of GaSb molecular layers different from that of the second GaSb portion.

In the light receiving device according to an embodiment, the first GaSb portion has the same number of group-III atomic layers as that of the second GaSb portion.

In the semiconductor light receiving device, the unit structure allows the first GaSb portion to have the same number of GaSb molecular layers as that of the second GaSb portion.

A light receiving device according to an embodiment includes: (a) a first conductivity-type III-V compound semiconductor layer; (b) a second conductivity-type III-V compound semiconductor layer; and (c) a light absorbing layer disposed between the first conductivity-type III-V compound semiconductor layer and the second conductivity-type III-V compound semiconductor layer. The light absorbing layer includes multiple unit structures arranged in a direction of an axis to form a type-II superlattice. Each unit structure includes one or more first molecular layers of InAs, one or more second molecular layers of GaSb, one or more third molecular layers of InSb, and one or more fourth molecular layers of GaSb. The unit structure includes the one or more first molecular layers, the one or more second molecular layers, the one or more third molecular layers, and the one or more fourth molecular layers.

The semiconductor light receiving device provides each unit structure with the second molecular layers of GaSb and the fourth molecular layers of GaSb separating the third molecular layers of InSb from the first molecular layers of InAs. The addition of the third molecular layers of InSb to a unit structure makes it possible to provide the unit structure with a reduced number of first molecular layers of InAs enabling a desired long-wavelength absorption edge.

In the light receiving device according to an embodiment, the unit structure includes one or more fifth molecular layers of InSb, and one or more sixth molecular layers of GaSb. In each unit structure, the one or more first molecular layers, the one or more second molecular layers, the one or more third molecular layers, the one or more fourth molecular layers, the one or more fifth molecular layers, and the one or more sixth molecular layers are arranged in the direction of the device axis.

The semiconductor light receiving device allows each unit structure to include the fifth and sixth molecular layers, and the fourth molecular layers, the fifth molecular layers and the sixth molecular layers are arranged in the direction of the device axis.

A light receiving device according to an embodiment includes: (a) a first conductivity-type III-V compound semiconductor layer; (b) a second conductivity-type III-V compound semiconductor layer; and (c) a light absorbing layer disposed between the first conductivity-type III-V compound semiconductor layer and the second conductivity-type III-V compound semiconductor layer, the light absorbing layer including multiple unit structures arranged in a direction of an axis to form a type-II superlattice. Each unit structure includes a single first group containing one or more InAs molecular layers, a single second group containing one or more GaSb molecular layers, one or more third groups containing one or more GaSb molecular layers, and one or more fourth groups containing one or more InSb molecular layers. In each unit structure, any of the third groups is disposed between the single second group and one of the fourth groups, and in the light absorbing layer, the single second group is disposed between the single first group and all the third groups.

The semiconductor light receiving device allows each unit structure to dispose the fourth group of InSb molecular layers between the second group of GaSb molecular layers and the third group of GaSb molecular layers, which separates the fourth group of InSb molecular layers from the first group of InAs molecular layers. The addition of the fourth group to a unit structure makes it possible to provide the unit structure with a reduced number of first molecular layers of InAs enabling a desired long-wavelength absorption edge.

The teachings of the present invention can be readily understood by considering the following detailed description with reference to the accompanying drawings shown as examples. Referring to the accompanying drawings, embodiments according to a semiconductor light receiving device will be illustrated below. When possible, the same portions will be denoted by the same reference numerals.

FIG. 1 is a schematic view showing a semiconductor light receiving device according to the present embodiment. The semiconductor light receiving device 1 can detect light in infrared wavelengths. The semiconductor light receiving device 1 includes a first conductivity-type semiconductor layer 4 of III-V compound semiconductor, a light receiving layer 5, and a second conductivity-type semiconductor layer 6 of III-V compound semiconductor. The light receiving layer 5 is disposed between the first conductivity-type semiconductor layer 4 and the second conductivity-type semiconductor layer 6. The first conductivity type semiconductor layer 4, the light receiving layer 5, and the second conductivity-type semiconductor layer 6 are arranged in the direction of the device axis T. The first conductivity-type semiconductor layer 4, the light receiving layer 5, and the second conductivity-type semiconductor layer 6 are grown by, for example, a molecular beam epitaxy method (hereinafter simply referred to as MBE method).

Figure 2:
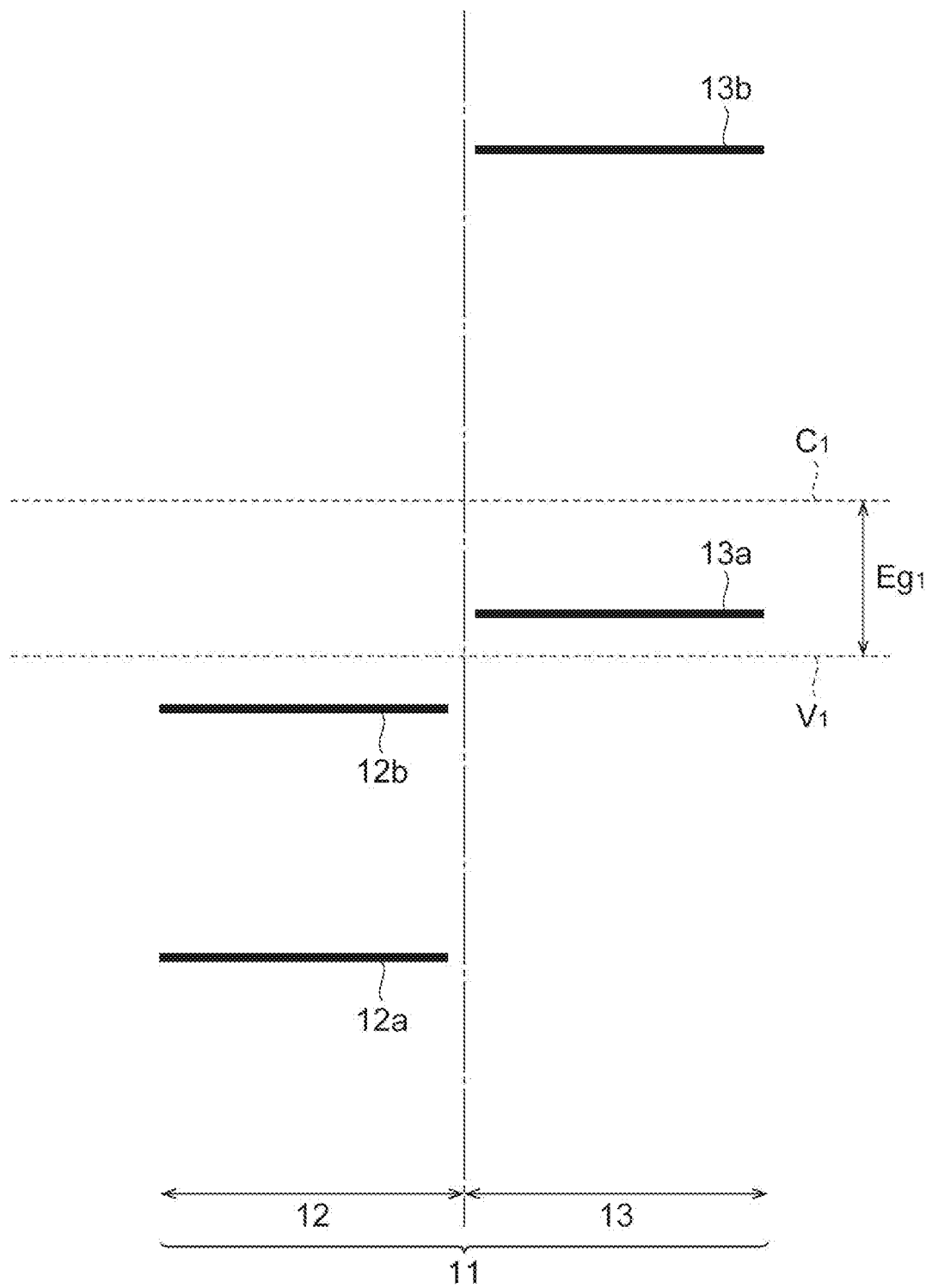
FIG. 2 is a schematic view showing a band diagram formed by an arrangement of unit structures of type-II superlattice.
Figure 3A:
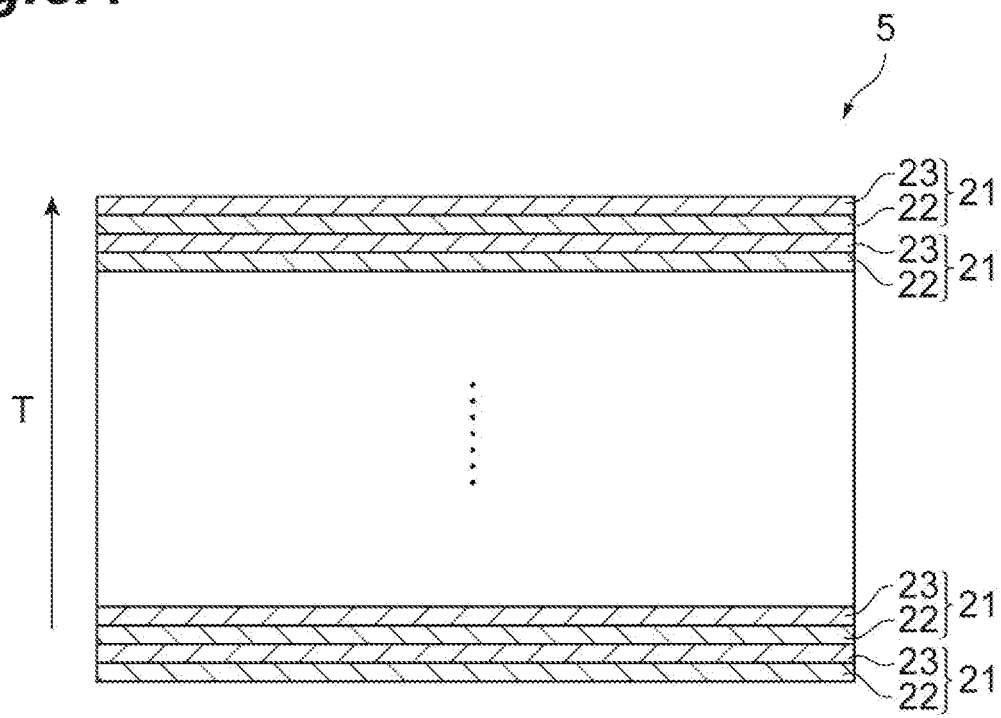
FIG. 3A is a schematic view showing a light receiving layer having unit structures stacked in the direction of the device axis.
Figure 3B:
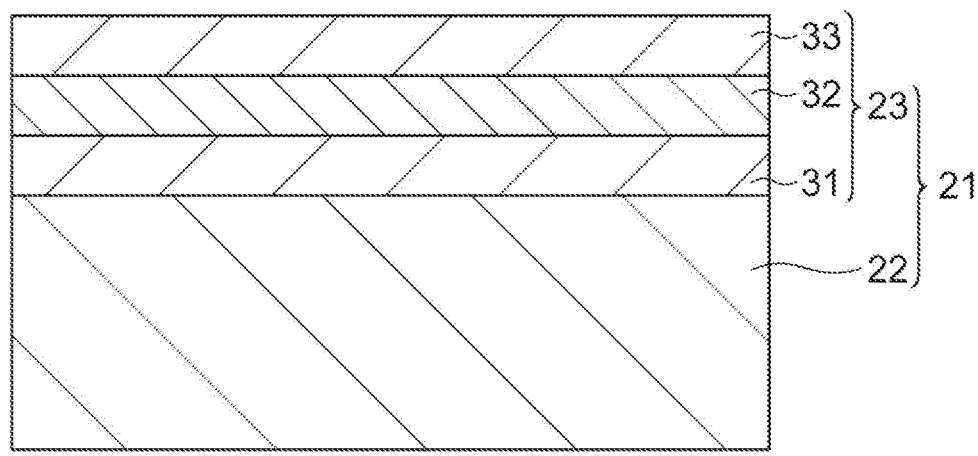
FIG. 3B is a schematic view showing a unit structure for the light receiving layer.

FIG. 2 is a view showing a band diagram produced of an arrangement of unit structures of type-II. FIG. 3A is a view showing a light-receiving layer including unit structures stacked in the direction of the device axis T. FIG. 3B is a view showing a unit structure for the light-receiving layer.

In FIG. 2, for ease of understanding, the superlattice structure includes an array of unit structures 11, each having two semiconductor layers 12 and 13 of different III-V compound semiconductor materials, for a type-II light-receiving layer. The type-II light-receiving layer will be described with reference to the unit structures 11, and the light-receiving layer has a superlattice structure sensitive to infrared light. The arrangement of the unit structures 11 has a superlattice structure forming a valence band V1, a conduction band C1, and a band gap Eg1 which is the difference between the edges of the valence and conduction bands V1 and C1. FIG. 2 also shows bulk valence and conduction bands 12a and 12b of semiconductor material for the semiconductor thin layer 12, and bulk valence and conduction band edges 13a and 13b of semiconductor material for the semiconductor thin layer 13. The valence and conduction bands V1 and C1 of the superlattice structure are different from the valence and conduction band edges 12a and 12b of the bulk semiconductor, and the valence and conduction band edges 13a and 13b of the bulk semiconductor.

The semiconductor thin layers 12 and 13 are alternately and periodically arranged to form a type-II superlattice structure. In the superlattice structure, electrons in the conduction band C1 show a large probability density in each semiconductor thin layer 12, and electrons in the valence band V1 show a large probability density in each semiconductor thin layer 13. These probability densities show that the difference in the spatial distribution of electrons between the conduction and valence bands C1 and V1 is large. This difference in electron distribution makes it difficult to increase the light receiving sensitivity having the type-II superlattice structure.

The semiconductor thin layer 12 includes one of the group-III and group-V constituent atoms bonded to the other of the semiconductor thin layer 13, so that the semiconductor thin layer 12 and the semiconductor thin layer 13 form an interface therebetween. As will be understood from the following description, the semiconductor thin layer 12 includes a single type of molecular layers, and the semiconductor thin layer 13 includes multiple types of molecular layers. Specifically, the semiconductor thin layer 12 includes multiple InAs molecular layers. The semiconductor thin layer 13 includes multiple GaSb molecular layers and one or more InSb molecular layers.

Referring to FIGS. 3A and 3B, the unit structures 21 of the light-receiving layer 5 are stacked in the direction of the device axis T to form a type-II superlattice structure of the band structure as shown in FIG. 2. Each unit structure 21 is formed of an InAs portion 22, a first GaSb portion 31, an InSb portion 32, and a second GaSb portion 33. The light-receiving layer 5 has the number of the unit structures 21 of, for example, 200. Molecular layers for the InAs portion 22, the first GaSb portion 31, the InSb portion 32, and the second GaSb portion 33 can be grown by, for example, molecular beam epitaxy.

The InAs portion 22 is formed of one or more InAs molecular layers, and the InAs molecular layers are arranged in the direction of the device axis T. The InAs portion 22 has the number of InAs molecular layers in a range of 1 to 20, for example, 10.
Layer thickness of the InAs portion 22: 0.3 nm to 2 nm.
A single InAs molecular layer has a single indium plane and a single arsenic plane and has a thickness of 0.3 nm. The long-wavelength absorption edge increases with the number of InAs molecular layers.

Each of the first GaSb portion 31 and the second GaSb portion 33 has a single GaSb molecular layer, or multiple GaSb molecular layers, which are arranged in the direction of the device axis T.
Number of GaSb molecular layers in the first GaSb portion 31: 1 to 10, for example, 2 molecular layers.
Number of GaSb molecular layers in the second GaSb portion 33: 1 to 10, for example 2 molecular layers.
Layer thickness of the first GaSb portion 31: for example, 0.3 to 3 nm.
Layer thickness of the second GaSb portion 33: for example, 0.3 to 3 nm.
A single GaSb molecular layer includes a single Ga plane and a single Sb plane, and has a thickness of 0.3 nm. The first GaSb portion 31 has the same number of GaSb molecular layer as that of the second GaSb portion 33. Alternatively, the first GaSb portion 31 has a number of GaSb molecular layers different from that of the second GaSb portion 33, and the difference in the number of molecular layers, biases the electron distribution in the valence band.

The InSb portion 32 has a single InSb molecular layer or multiple InSb molecular layers, which are arranged in the direction of the device axis T.
Number of InSb molecular layers: for example, 1 to 3.
Layer thickness of the InSb portion 32: for example, 0.3 to 0.9 nm.
An InSb molecular layer has a single indium plane and a single antimony plane and has a thickness of 0.3 nm. The InSb portion 32 which is disposed between the first GaSb portion 31 and the second GaSb portion 33, receives compressive stress on both sides thereof.

As can be understood from the description with reference to FIG. 2, the InAs portion 22 of binary alloy has a large probability amplitude of electron in the conduction band of the superlattice structure. The GaSb/InSb portion 23 of binary alloy, which includes the first GaSb portion 31, the InSb portion 32 and the second GaSb portion 33, has a large probability amplitude of electron in the valence band of the superlattice structure.

The light-receiving layer 5 is sensitive to light in the infrared wavelengths of 2 to 20 micrometers.

The unit structure 21 includes an InAs portion 22, a first GaSb portion 31, an InSb portion 32, and a second GaSb portion 33, which are arranged in the direction of the device axis T. Alternatively, the unit structure 21 includes an InAs portion 22, multiple first GaSb portions 31 and multiple InSb portions 32 alternately arranged, and a second GaSb portion 33, which are arranged in the direction of the device axis T.

Referring again to FIG. 1, a description will be given of the first conductivity-type semiconductor layer 4 and the second conductivity-type semiconductor layer 6 in the semiconductor light receiving device 1.

In the embodiment, the first conductivity-type semiconductor layer 4 has a type II superlattice structure. This superlattice structure has an array of unit structures and includes, for example, multiple semiconductor layers alternately stacked. These semiconductor layers are designed so that the type-II superlattice structure works as a hole blocking layer. Specifically, the first conductivity-type semiconductor layer 4 has a bandgap energy larger than that of the light receiving layer 5. In this embodiment, the superlattice structure of the first conductivity-type semiconductor layer 4 includes an n-type group-III-V semiconductor.
Exemplary first conductivity-type semiconductor layer 4.
Unit structure of superlattice: GaSb layer (2 to 6 nm thick) and InAs layer (1 to 6 nm thick).
Thickness of the unit structure: 4 to 12 nm.
Stacking number of layers: for example, 50 to 200.
Thickness of the first conductivity-type semiconductor layer 4: for example, 0.2 to 2.4 micrometers.
Growth recipe of GaSb and InAs layers.
Growth method: MBE.
Growth temperature: 400 to 600 degrees Celsius.
Growth rate: 0.03 to 0.1 nm/sec.
N-type dopant, such as Si (silicon) or Te (tellurium) for at least one of the GaSb layers and the InAs layers.

In the embodiment, the second conductivity-type semiconductor layer 6 has a type-II superlattice structure. This superlattice structure has an array of unit structures, and includes, for example, multiple semiconductor layers alternately stacked. These semiconductor layers are designed so that the type-II superlattice structure works as an electron blocking layer. Specifically, the second conductivity-type semiconductor layer 6 has a bandgap energy larger than that of the light receiving layer 5. In the embodiment, the superlattice structure of the second conductivity-type semiconductor layer 6 includes a p-type III-V semiconductor.
Exemplary second conductivity-type semiconductor layer 6.
Unit structure of superlattice: GaSb layer (2 to 6 nm thick) and InAs layer (1 to 6 nm thick).
Thickness of the unit structure: 4 to 12 nm.
Stacking number of layers: for example, 50 to 200.
Thickness of the first conductivity-type semiconductor layer 4: for example, 0.2 to 2.4 micrometers.
Growth recipe of GaSb and InAs layers.
Growth method: MBE.
Growth temperature: 400 to 600 degrees Celsius.
Growth rate: 0.03 to 0.1 nm/sec.
At least one of the GaSb layer and the InAs layer can be doped with p-type dopant, such as Be (beryllium), B (boron), C (carbon), Zn (zinc).

The semiconductor light receiving device 1 further includes a first electrode 2, a substrate 3, a contact layer 7, and a second electrode 8.

In the embodiment, the substrate 3 is made of an n-type III-V semiconductor, and the substrate 3 may be doped with n-type dopant. The group III-V semiconductor includes GaSb. The substrate 3 has a principal surface 3a and a back surface 3b. The substrate of GaSb can reduce residual strain (amount of residual strain per unit structure) in the InAs portion. This makes it possible to increase the upper limit of the stacking number of unit structures in the light receiving layer and makes the light receiving sensitivity of the semiconductor light receiving device 1 improved.

The contact layer 7 includes a p-type III-V semiconductor, and is disposed on the second conductivity-type semiconductor layer 6. This III-V semiconductor is doped with p-type dopant. The contact layer 7 has a thickness of, for example, 50 nm. The contact layer 7 can include a bulk semiconductor layer, and alternatively can have a superlattice structure including GaSb layers and InAs layers. In the superlattice structure, at least one of the GaSb layer and the InAs layer may be doped with dopant.

The substrate 3, the first conductivity-type semiconductor layer 4, the light receiving layer 5, the second conductivity-type semiconductor layer 6, and the contact layer 7 are arranged in the direction of the device axis T. The first electrode 2 makes contact with the back surface 3b of the substrate 3, and the second electrode 8 makes contact with the contact layer 7.

The first electrode 2 makes contact with the substrate 3, and if needed, the first conductivity-type semiconductor layer 4. In the embodiment, the first electrode 2 makes contact with the back surface 3b of the substrate 3. The first electrode 2 may include a metal multilayer, such as Au (gold), Ti (titanium), Pt (platinum), or a single metal layer.

The second electrode 8 is in contact with the contact layer 7, and if needed, the second conductivity-type semiconductor layer 6, and in the present embodiment, the second electrode 8 makes contact with the contact layer 7. The second electrode 8 can include metal, such as Au, Ni (nickel), Pd (palladium), Sb (antimony), Zn (zinc), Be (beryllium), or an alloy thereof.

The first and second electrodes 2 and 8 can be formed by metal deposition, such as vapor deposition or sputtering, and patterning of metal film, such as lift-off or etching.

In the present embodiment, the semiconductor light receiving device 1 provides the second electrode 8 with an optical window a1, which is disposed on the top thereof to receive light incident on the front face. The semiconductor light receiving device 1 may be back-illuminated.

Light L incident on the semiconductor light receiving device 1 passes through the first conductivity-type semiconductor layer 4 or the second conductivity-type semiconductor layer 6 to the light receiving layer 5. The absorption layer 5 has an absorption edge of wavelength of the superlattice structure, and the absorption layer also determines the longer limit of the wavelength of light that the light-receiving layer 5 can detect (for example, 15 micrometers).

A description will be given of several embodiments below.

In FIGS. 4 to 11, the vertical axis indicates the probability density of electron, and the horizontal axis indicates the positions of the group-III and group-V atomic planes of the molecular layers in the unit structure. In FIGS. 4, 6, 8 and 10, open circles 42, 43, 44, and 45 each indicate the occupation probability of electron at each of the group-III atomic planes in the conduction band, and graphs 62, 63, 64, and 65 each represent the probability density of electron in the conduction band of the unit structure. Black circles 52, 53, 54, and 55 each indicate occupation probability of electron at each of the group-V atomic planes in the valence band, and graphs 72, 73, 74, and 75 each represent the probability density of electron. The probability density of electron is obtained by squaring the absolute value of the wave function. Each of graphs 82, 93, 84 and 85 represents the product of the wave function of electron at a certain group-III atomic plane in the conduction band and the complex-conjugated wave function of electron at a group-V atomic plane located closest to the group-III atomic plane, and this product relates to the probability of electron in interband transition between the valence and conduction bands associated with these atomic planes. The optical transition probability in the unit structure 21 relates to the product of the probability of the interband transition and the probability of the optical interaction between electrons and light. It is assumed that the transition and the interaction in the unit structure according to the present embodiment is a substantially integrated interaction. Graphs 82, 83, 84 and 85 defines hatched regions R2, R3, R4 and R5, respectively, and each of the hatched regions R2, R3, R4 and R5 indicates the optical transition probability in the light receiving layer (the unit structure). In the semiconductor light receiving device, the unit structure with a large hatched area enables a high light receiving sensitivity.

(Structure 1S)

Figure 4:
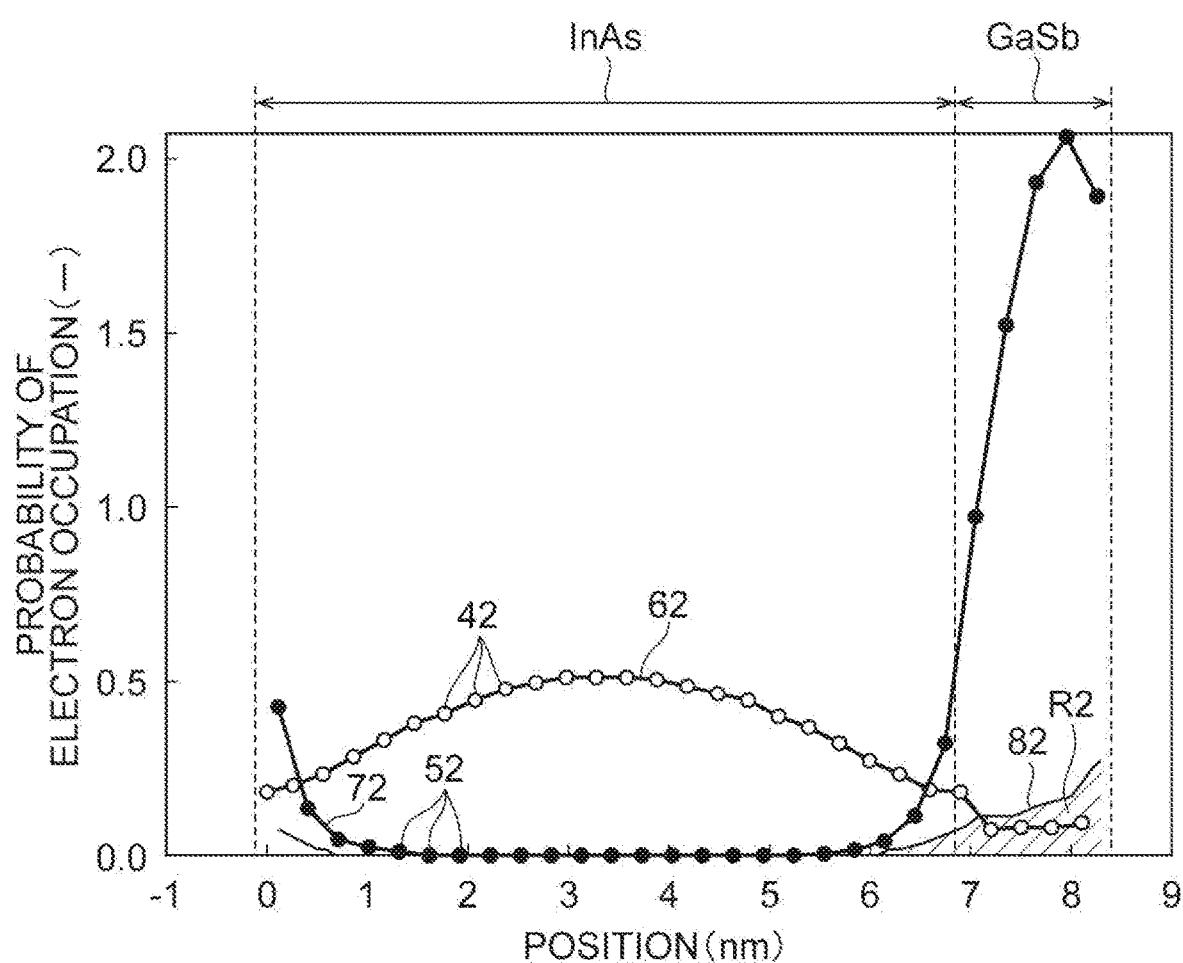
FIG. 4 is a view showing the occupation probability of electron in a light-receiving layer including an array of unit structures each having an InAs portion and a GaSb portion.
Figure 5:
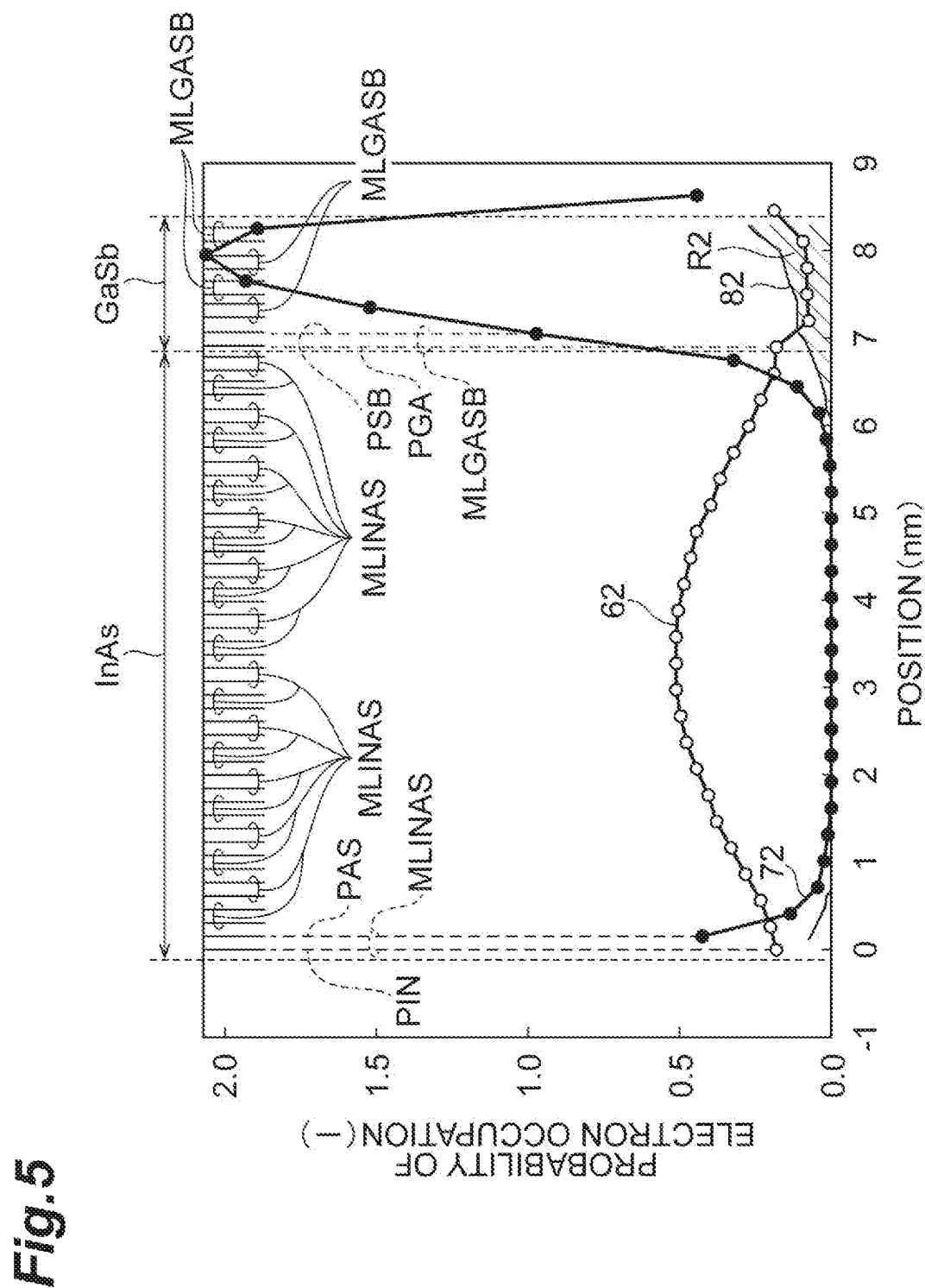
FIG. 5 is a view showing the occupation probability of electron in the array of unit structures shown in FIG. 4.

FIG. 4 shows the probability density of electron in the light-receiving layer including the arrangement of unit structures having the InAs portion and the GaSb portion. FIG. 5 shows the probability density of electron in the arrangement of the unit structures shown in FIG. 4. The unit structure shown in FIG. 4 is made of twenty-three InAs molecular layers and five GaSb molecular layers. The unit structure has an absorption edge of wavelength of 15 micrometers.

Referring to FIG. 5, the InAs portion includes twenty-three InAs molecular layers MLINAS, and the GaSb portion includes five GaSb molecular layers MLGASB. Each of the InAs molecular layers MLINAS includes a single V-group atomic plane (arsenic plane) and a single group-III atomic plane (indium plane). Each GaSb molecular layer MLINAS includes a single group-V atomic plane (antimony plane) and a single group-III atomic plane (gallium plane). In the unit lattice according to the present embodiment, arsenic atoms of the group-V element are bonded to gallium atoms of the group-III element to form the interface between the InAs portion and the GaSb portion.

(Structure 2S)

Figure 6:
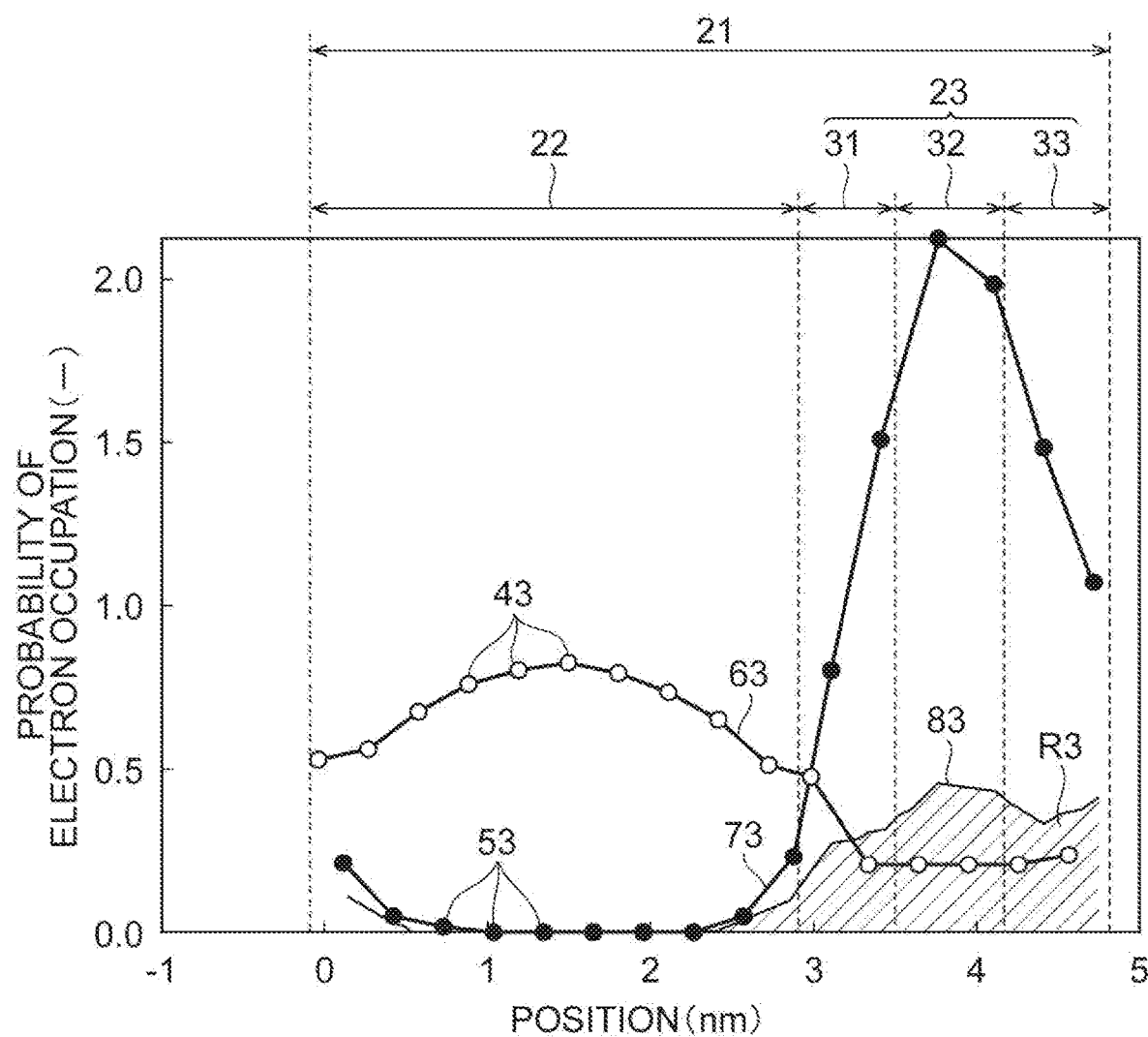
FIG. 6 is a view showing the occupation probability of electron in a light-receiving layer including an array of unit structures each having an InAs portion, an InSb portion, a GaSb portion, and an InSb portion.
Figure 7:
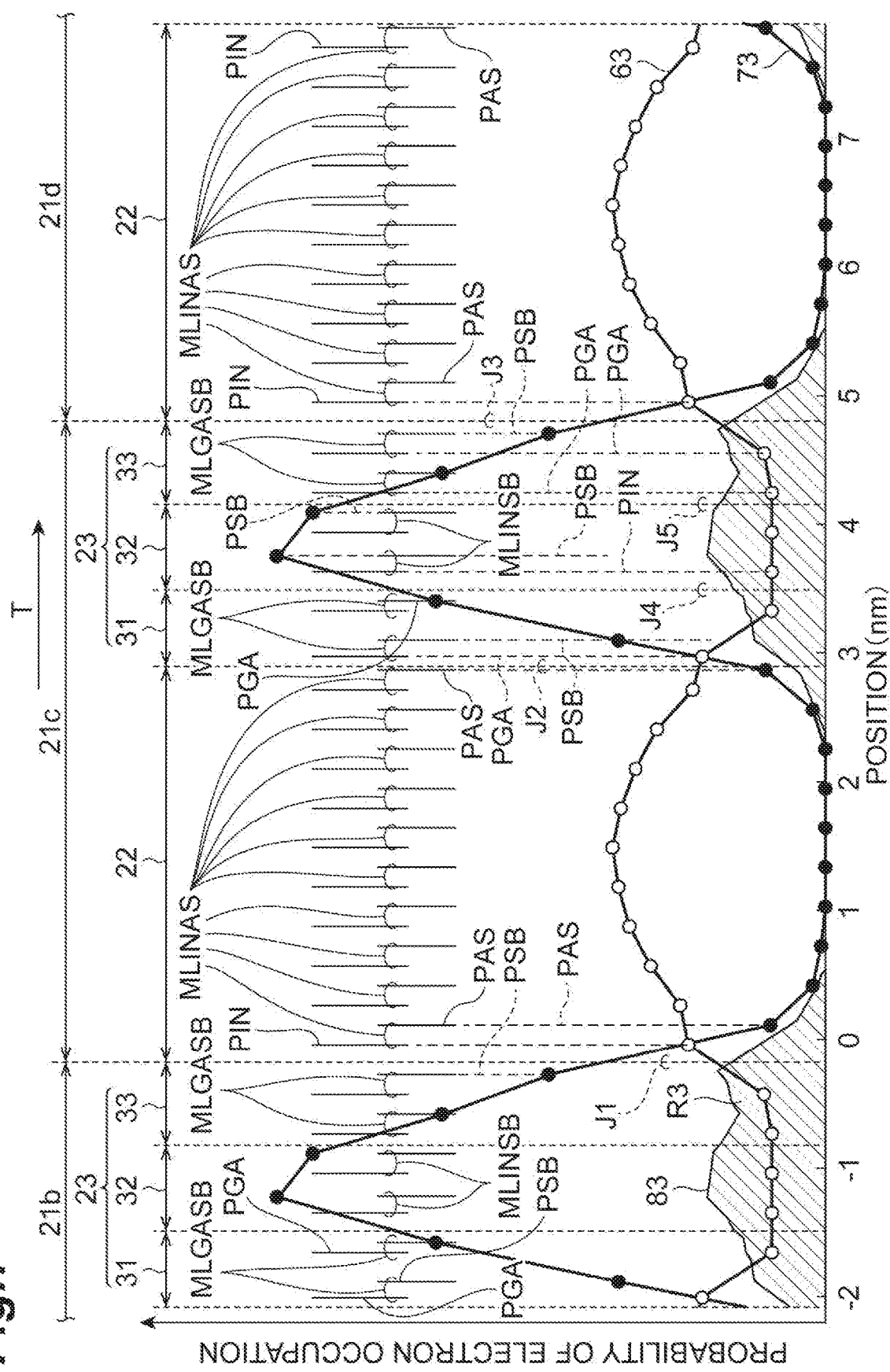
FIG. 7 is a view showing the occupation probability of electron in the array of the unit structures shown in FIG. 6.

FIG. 6 shows the probability density of electron in a light-receiving layer including an array of unit structures each having an InAs portion, an InSb portion, a GaSb portion, and an InSb portion. FIG. 7 shows the probability density of electron in the arrangement of the unit structures shown in FIG. 6. Each unit structure shown in FIG. 6 is made of ten InAs molecular layers, two InSb molecular layers, two GaSb molecular layers, and two InSb molecular layers. The unit structure has an absorption edge of wavelength of 15 micrometers.

Referring to FIG. 7, unit structures 21b, 21c, and 21d are shown for two cycles. The unit structures 21b, 21c, and 21d are arranged in the direction of the device axis T. In each unit structure 21, the InAs portion 22 includes thirteen InAs molecular layers MLINAS, and this number of the InAs portion 22 is smaller than twenty-three InAs molecular layer MLINAS in the structure 1S. The first GaSb portion 31 includes two GaSb molecular layers MLGASB. The InSb portion 32 includes two InSb molecular layers MLINSB. The second GaSb portion 33 includes two GaSb molecular layers MLGASB. Each of the InAs molecular layers MLINAS includes a single In plane PIN and a single As plane PAS. Each of the GaSb molecular layers MLGASB contains a single Ga plane PGA and a single Sb plane PSB. Each of the InSb molecular layers MLINSB includes a single In plane PIN and a single Sb plane PSB. Each unit structure includes nineteen molecular layers in total.

The arrangement of the GaSb portion 31, the InSb portion 32, the GaSb portion 33, the InAs portion 22, the GaSb portion 31, the InSb portion 32, the GaSb portion 33, and the InAs portion 22 in the unit structures 21b, 21c, and 21d forms interfaces (J1, J2, J3, J4, and J5).

Specifically, in the unit structure 21b, the antimony plane (Sb plane PSB) of the group V element in the second GaSb portion 33 is bonded to the indium plane of the group-III element (In plane PIN) at the junction J1. In the unit structure 21c, the arsenic plane (As plane PAS) of the group-V element in the InAs portion 22 is bonded to the gallium plane (Ga plane PGA) of the group-III element in the second GaSb portion 33 at the junction J2. The antimony plane (Sb plane PSB) of the group-V element in the second GaSb portion 33 in the unit structure 21c is bonded to the indium plane (In plane PIN) of the group-III element in the InAs portion 22 of the unit structure 21d at the junction J3.

The Sb plane PSB of the group-V element in the first GaSb portion 31 in the unit structure 21c is bonded to the In plane PIN of the group-III element in the InSb portion 32 in the unit structure 21c at the junction J4. In the unit structure 21c, the Sb plane PSB of the group-V element in the InSb portion 32 is bonded to the Ga plane PGA of the group-III element in the second GaSb portion 33.

(Structure 3S)

Figure 8:
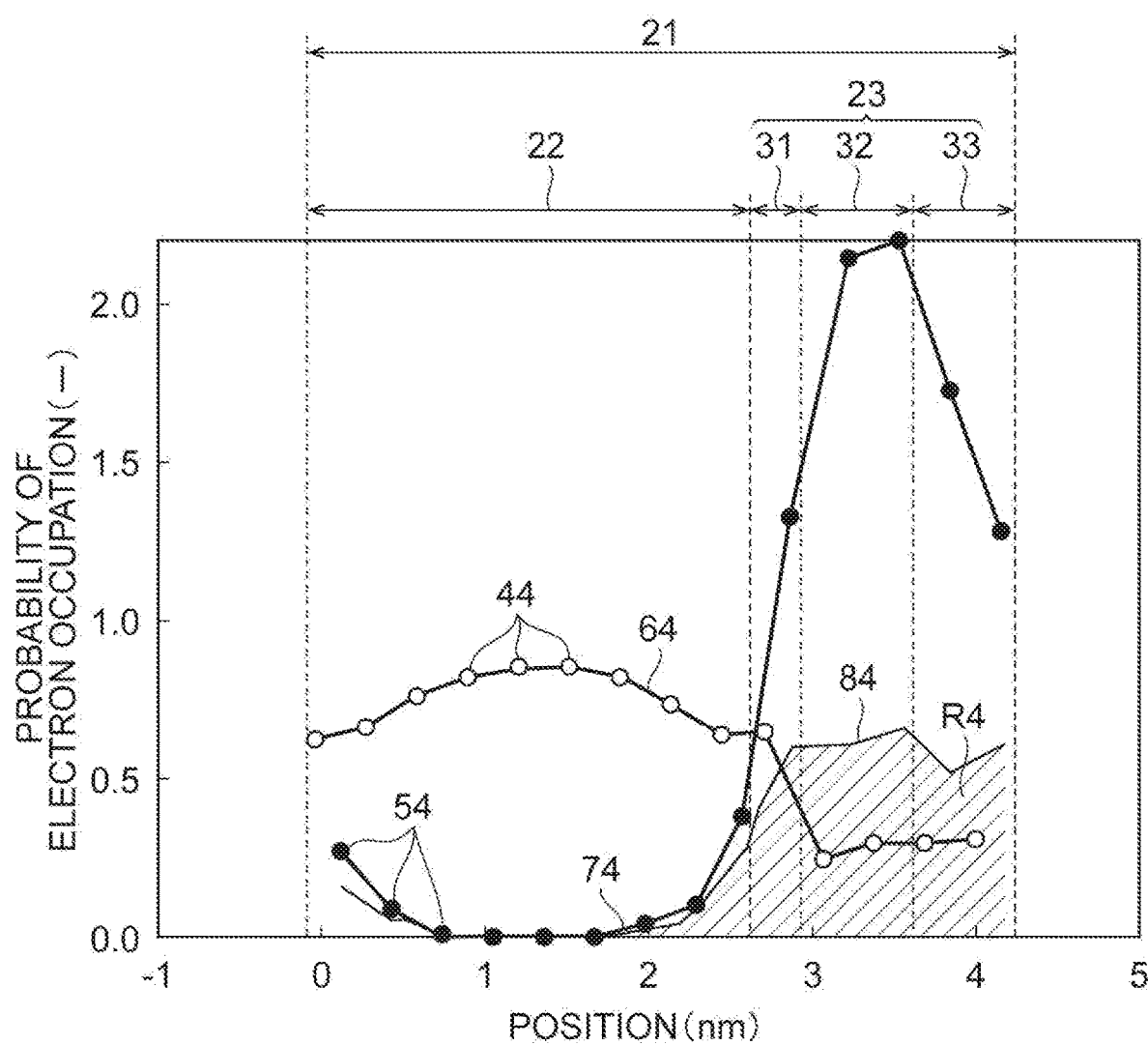
FIG. 8 is a view showing the occupation probability of electron in a light-receiving layer including an array of unit structures each having an InAs portion, an InSb portion, a GaSb portion, and an InSb portion.
Figure 9:
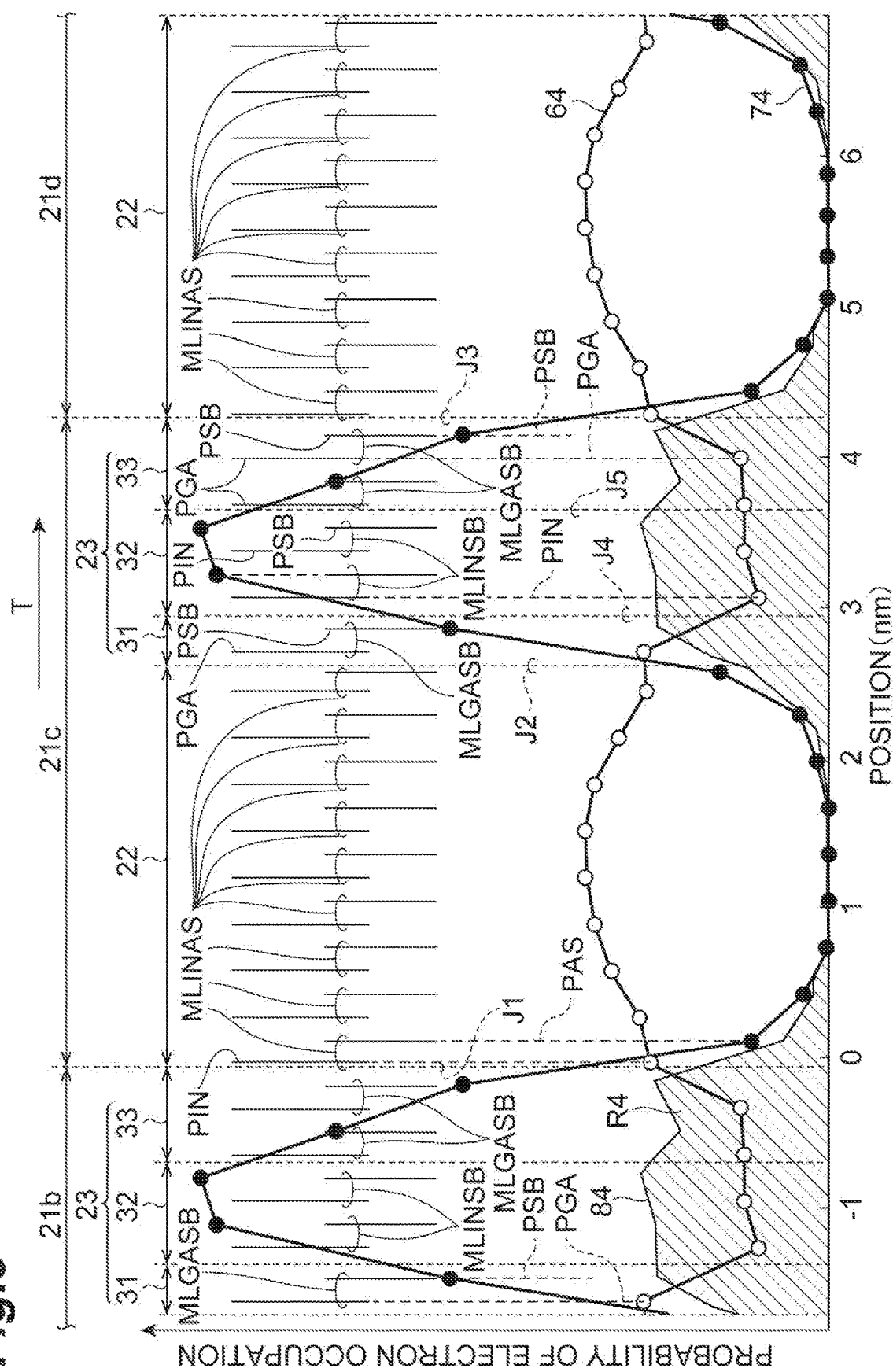
FIG. 9 is a view showing the occupation probability of electron in the array of unit structures shown in FIG. 8.

FIG. 8 shows the probability density of electron in the light-receiving layer including an array of unit structures each having an InAs portion, an InSb portion, a GaSb portion, and an InSb portion. FIG. 9 shows the probability density of electron in the arrangement of the unit structures shown in FIG. 8. Each unit structure shown in FIG. 8 is made of nine InAs molecular layers, one InSb molecular layer, two GaSb molecular layers, and two InSb molecular layers. The absorption edge of wavelength of this unit structure is 15 micrometers.

Referring to FIG. 9, unit structures 21b, 21c, 21d for two cycles are shown. The unit structures 21b, 21c, and 21d are arranged in the direction of the device axis T. In each unit structure 21, the InAs unit 22 includes nine InAs molecular layers MLINAS, and this number is smaller than twenty-three InAs molecular layers MLINAS of the InAs portion 22 in the structure 1S. The first GaSb portion 31 includes one GaSb molecular layer MLGASB. The InSb portion 32 includes two InSb molecular layers MLINSB. The second GaSb portion 33 includes two GaSb molecular layers MLGASB. Each unit structure includes 14 molecular layers.

The arrangement of the GaSb portion 31, the InSb portion 32, the GaSb portion 33, the InAs portion 22, the GaSb portion 31, the InSb portion 32, the GaSb portion 33, and the InAs portion 22 in the unit structures 21b, 21c, and 21d for two cycles contains interfaces (J1, J2, J3, J4, and J5).

(Structure 4S)

Figure 10:
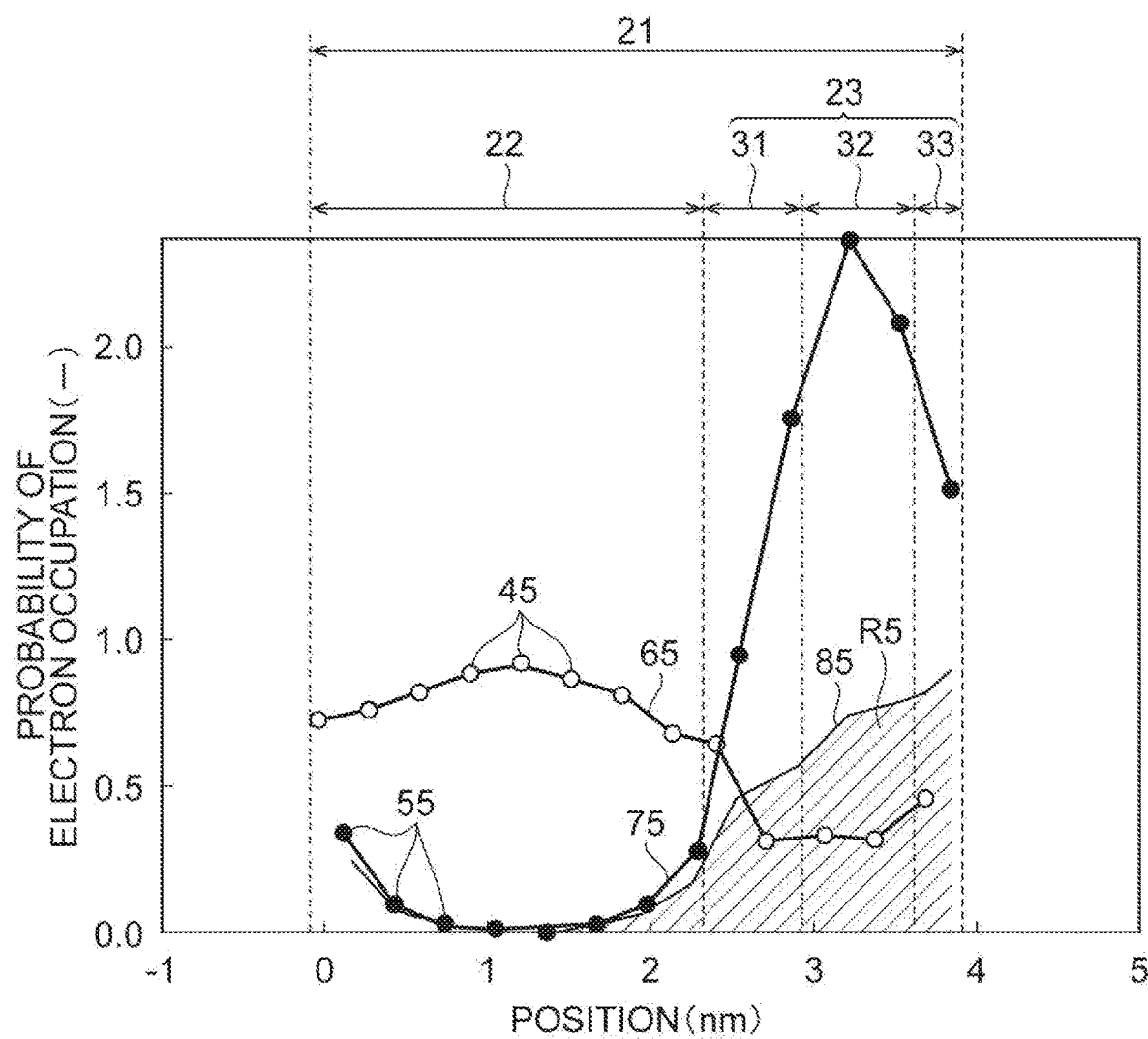
FIG. 10 is a view showing the occupation probability of electron in a light-receiving layer including an array of unit structures each having an InAs portion, an InSb portion, a GaSb portion, and an InSb portion.
Figure 11:
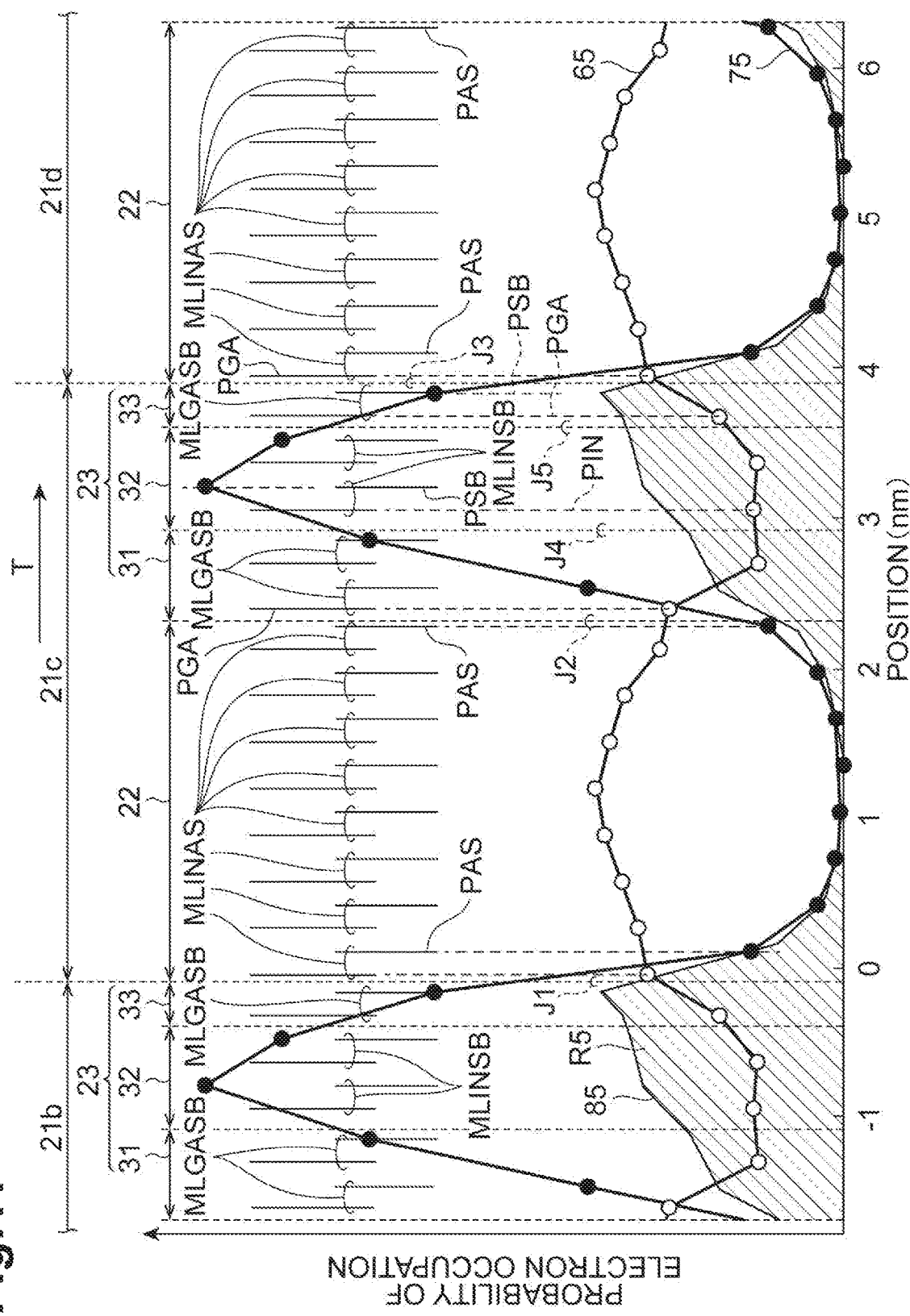
FIG. 11 is a view showing the occupation probability of electron in the array of unit structure shown in FIG. 10.

FIG. 10 shows the probability density of electron in the light receiving layer including an array of unit structures each having an InAs portion, an InSb portion, a GaSb portion and an InSb portion. FIG. 11 shows the probability density of electron in the arrangement of the unit structures shown in FIG. 10. Each unit structure shown in FIG. 10 is made of eight InAs molecular layers, two InSb molecular layers, two GaSb molecular layers, and one InSb molecular layer. This unit structure has an absorption edge of wavelength of 15 micrometers.

Referring to FIG. 11, unit structures 21b, 21c, and 21d are shown for two cycles. The unit structures 21b, 21c, and 21d are arranged in the direction of the device axis T. In each unit structure 21, the InAs portion 22 includes eight InAs molecular layers MLINAS, and the number of InAs molecular layers is smaller than twenty-three InAs molecular layers MLINAS in the InAs portion 22 in the structure 1S. The first GaSb portion 31 includes two GaSb molecular layers MLGASB. The InSb portion 32 includes two InSb molecular layers MLINSB. The second GaSb portion 33 includes one GaSb molecular layer MLGASB. Each unit structure 21 includes 13 molecular layers in total.

The arrangements of the GaSb portion 31, the InSb portion 32, the GaSb portion 33, the InAs portion 22, the GaSb portion 31, the InSb portion 32, the GaSb portion 33, and the InAs portion 22 in the unit structures 21b, 21c, and 21d includes interfaces (J1, J2, J3, J4, and J5).

The InAs portion of the structure 1S includes twenty-three InAs molecular layers and has a thickness of about 7 nm. The absorption layer in the structure 1S has an absorption edge of wavelength of 15 micrometers.

In order to make the absorption edge of wavelength in the absorption layer large, the structure 1S requires a large number of InAs molecular layers in the InAs portion. Inventor's knowledge shows that this unit structure makes electrons in the conduction band localized in the InAs portion. The arrangement of a large number of InAs molecular layers makes the energy level of the conduction band edge lowered, and makes the barrier of the GaSb portion to electron high. This large barrier to electron provides electrons in the InAs portion in the unit structure with a low probability, which hinders electrons in the InAs portion from transferring to the InAs portion in the adjoining unit structure by tunneling. The low tunneling probability confines electrons in the InAs portion and localizes them. In the GaSb portion, the valence band provides electrons near the bottom thereof with large effective mass to localize the electrons therein. These localizations hardly excite electrons in the vicinity of the bottom of the valence band to the bottom of the conduction band.

In the light-receiving layer (the light-receiving layer of the structure 1S) including an array of unit structures including the InAs molecular layers and the GaSb molecular layers, the arrangement of a large number of InAs molecular layers enabling the long absorption edge of wavelength reduces the overlap between the wave function of electron, which has a large amplitude in the InAs portion, in the conduction band and the wave function of electron in the valence band in the GaSb region, which has a large amplitude.

The InAs portion in each of the structures 2S to 4S includes 8 to 13 InAb molecular layers, and has a thickness of about 3 nm. These superlattice structures in the structures 2S to 4S each use a binary molecular layer. Specifically, the GaSb portion (31 and 33) includes one or two GaSb molecular layers, and the InSb portion (32) includes two InSb molecular layers. The absorption layers of these structures each have an absorption edge of wavelength of 15 micrometers.

The unit structures in the structures 2S to 4S each include an InSb layer 32 between the first GaSb portion 31 and the second GaSb portion 33. The bandgap of the InSb bulk layer is smaller than that of the GaSb bulk layer, and the addition of the InSb portion 32 to a unit structure allows the unit structure thus added, which has a smaller number of InAs molecular layers than the structures 1S, to have a desired absorption edge of wavelength, for example, 15 micrometers. The InAs portion having a small number of InAs molecular layers makes the localization of electrons in the conduction band in the InAs portion weakened. This small localization can provide the semiconductor light receiving device 1 with improved light receiving sensitivity to infrared long wavelengths. For example, the hatched region R3 has an area larger than that of the hatched region R2.

Each of the structures 2S to 4S includes a binary InAs portion, a binary GaSb portion, and a binary InSb portion. At the boundary between the binary InAs and GaSb portions, the group-III atoms in the binary InAs portion can be bonded to a single kind of group-V atoms in the binary GaSb portion, and the group-V atoms in the binary InAs portion can be bonded to a single kind of group-III atoms in the binary GaSb portion. At the boundary between the binary GaSb and InSb portions, the group-III atoms in the binary InSb portion can be bonded to a single kind of group-V atoms in the binary GaSb portion, and the group-V atoms in the binary InSb portion can be bonded to a single kind of group-III atoms in the binary GaSb portion. Using binary alloys in the unit structure can avoid variations in the kind of chemical bond at the interfaces therein, and no variation in the chemical bonds makes device characteristics of the semiconductor light receiving device 1 stable. This brings the semiconductor light receiving device 1 a desired absorption edge of wavelength with high reproducibility.

The unit structure of the structure 3S (InAs/GaSb/InSb/GaSb has numbers of molecular layers of 9/1/2/2) includes a bond between the As plane of the InAs portion and the Ga plane of the GaSb portion. The number of the GaSb molecular layers between the arrangement of the InAs molecular layers in the InAs portion and the arrangement of the InSb molecular layers in the InSb portion in a certain unit structure is the same as that of the GaSb molecular layers between the arrangement of the InSb molecular layers in the InSb portion in the certain unit structure and the InAs molecular layer of the InAs part in the adjacent unit structure. The hatched region R4 has an area larger than that of the hatched region R3.

The unit structure (InAs/GaSb/InSb/GaSb has numbers of molecular layers of 8/2/2/1) of the structure 4S has an interface between the As plane of the InAs portion and the Ga plane of the GaSb portion. The number of the GaSb molecular layers between the arrangement of the InAs molecular layers in the InAs portion and the arrangement of the InSb molecular layers in the InSb portion in a certain unit structure is larger than that of the GaSb molecular layers between the arrangement of the InSb molecular layers in the InSb portion in the unit structure and the arrangement of the InAs molecular layers in the InAs portion in the adjacent unit structure. The hatched area R5 has an area larger than that of the hatched area R3.

The number of the InAs molecular layers in the structure 4S is smaller than that of the InAs molecular layers in the structure 3S.

Figure 12:
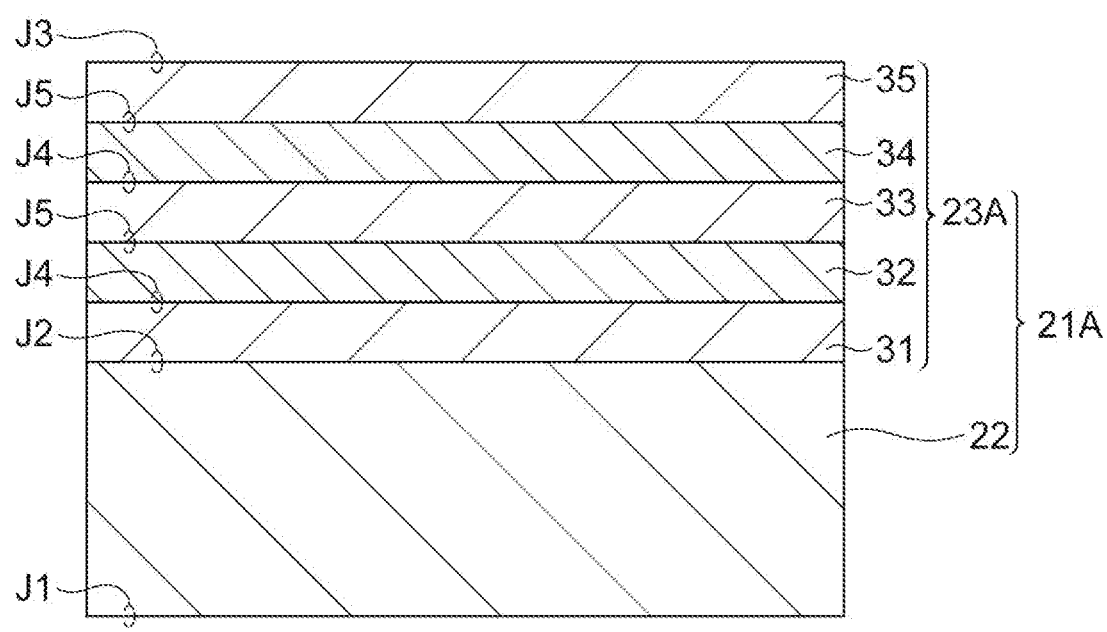
FIG. 12 is a view showing a unit structure for the light-receiving layer according to the present embodiment.

Each of the structures 2S, 3S, and 4S has an InAs portion 22, a first GaSb portion 31, an InSb portion 32, and a second GaSb portion 33 in the unit structure 21. FIG. 12 is a view showing a unit structure for the light-receiving layer according to the embodiment. The light-receiving layer 5 according to the present embodiment can include a unit structure 21A. The unit structure 21A includes an InAs portion 22, a first GaSb portion 31, an InSb portion 32, a second GaSb portion 33, an InSb portion 34, and a GaSb portion 35, which are sequentially arranged in the direction of the device axis T. The InSb portion 34 may include one or more InSb molecular layers, and the GaSb portion 35 may include one or more GaSb molecular layers. The unit structure 21 can reduce the number of InAs molecular layers in the InAs portion, and enables a desired absorption edge of wavelength. The binary GaSb/InSb portion 23A may include three or more GaSb portions and two or more InSb portions.

Each of the structures 2S, 3S, and 4S includes a chemical bond between the As plane of the InAs portion and the Ga plane of the GaSb portion in the unit structure 21. The unit structure according to the present embodiment is not limited thereto. Each of the structures 2S, 3S, and 4S may have a chemical bond between the Sb plane of the second GaSb portion 33 and the In plane of the InAs portion 22, and in order to provide the structures 2S, 3S, and 4S with this chemical bond, molecular layers in the first GaSb portion 31, the InSb portion 32, the second GaSb portion 33, and the InAs portion 22 can be arranged.

Furthermore, the unit structure 21A includes a chemical bond between the As plane of the InAs portion 22 and the Ga plane of the GaSb portion 31. This unit structure according to the present embodiment is not limited thereto, and may include a chemical bond between the Sb plane of the GaSb portion 35 and the In plane of the InAs portion 22, and in order to provide the unit structure with the above chemical bond, the InAs portion 22, the first GaSb portion 31, the InSb portion 32, the second InP portion 32, the InSb portion 32, and the InAs portion 32 can be arranged.

Binary GaSb/InSb portion 23 and binary GaSb/InSb portion 23A both are different from ternary mixed crystal (GaInSb).

As shown in FIGS. 7, 9 and 11, the light receiving layer 5 of the semiconductor light receiving device 1 has an unit structure 21 (21A), which includes an InAs portion 22, a first GaSb portion 31, an InSb portion 32, and a second GaSb portion 33. The InAs portion 22 includes multiple InAs molecular layers MLINAS, and these InAs molecular layers MLINAS are arranged in the direction of the device axis T. The first GaSb portion 31 has a GaSb molecular layer MLGASB, and this GaSb molecular layer MLGASB has one atomic plane (specifically, one of the group V atomic plane and the group-III atomic plane) which is bonded to the atomic plane of the group-III atomic plane of the InAs portion 22 (specifically, the other of the group-V atomic plane and the group-III atomic plane). The InSb portion 32 has an InSb molecular layer MLINSB, and this InSb molecular layer MLINSB has an atomic plane (specifically, one of the group-V atomic plane and the group-III atomic plane) bonded to the atomic plane of the first GaSb portion 31 (specifically, the other of the group-V atomic plane and the group-III atomic plane). The second GaSb portion 33 has a GaSb molecular layer MLGASB. This GaSb molecular layer MLGASB has an atomic plane (specifically, one of the group V-atomic plane and the group-III atomic plane) bonded to the atomic plane of the InSb portion 32 (specifically, the other atomic plane of the group-V atomic plane and the group-III atomic plane).

In the illustrative unit structure 21 (21A), the first GaSb portion 31 has a GaSb molecular layer including a gallium plane (or an antimony plane) bonded to the arsenic plane (or an indium plane) of the InAs portion 22. The InSb portion 32 has an InSb molecular layer including an indium plane (an antimony plane) bonded to the antimony plane (or a gallium plane) of the first GaSb portion. The second GaSb portion 33 has a GaSb molecular layer including a gallium plane (an antimony plane) bonded to the antimony plane (the indium plane) of the InSb portion.

Figure 13:
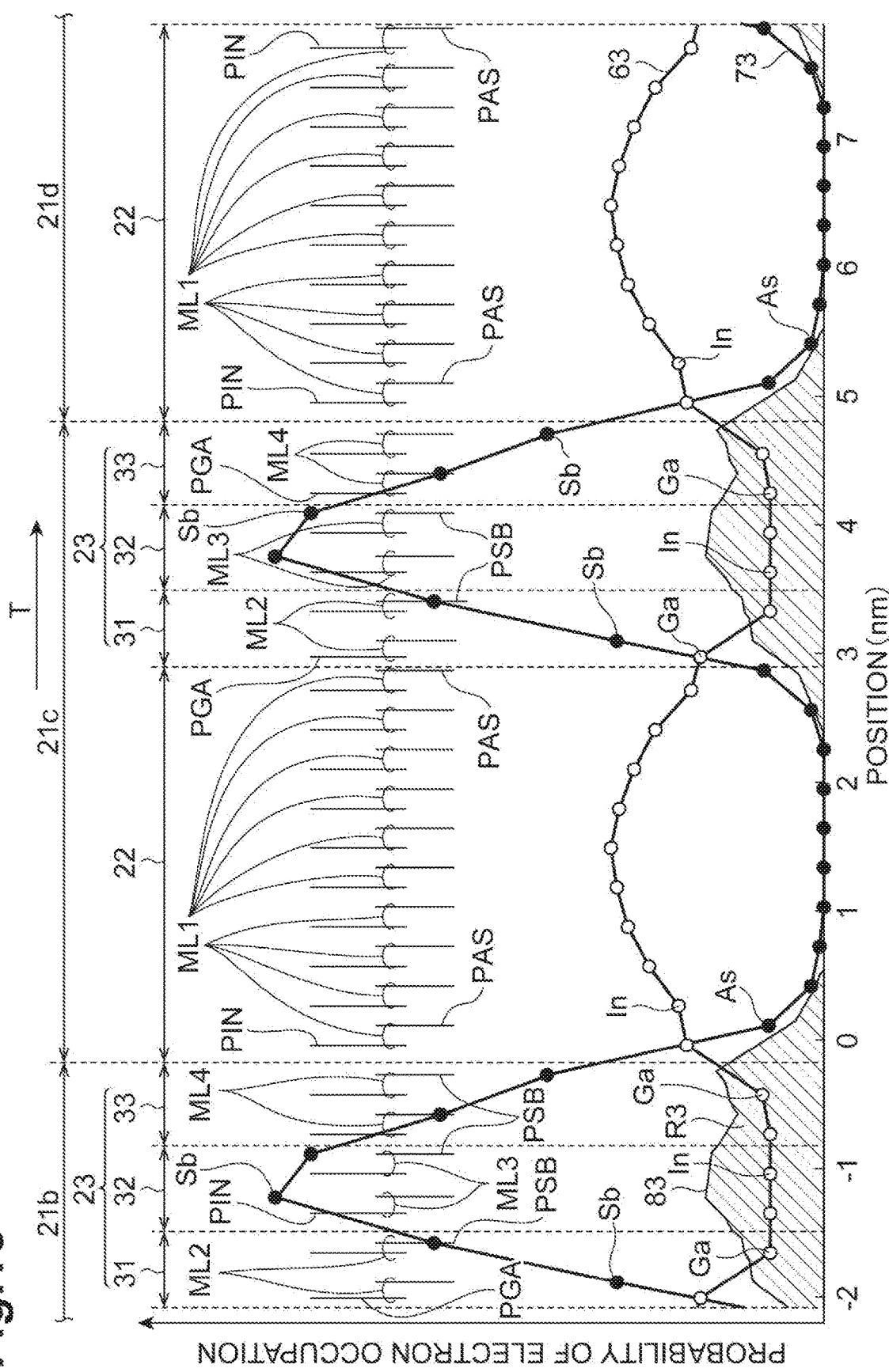
FIG. 13 is a view showing the array of molecular layers in the unit structure for the light-receiving layer according to the embodiment.
Figure 14:
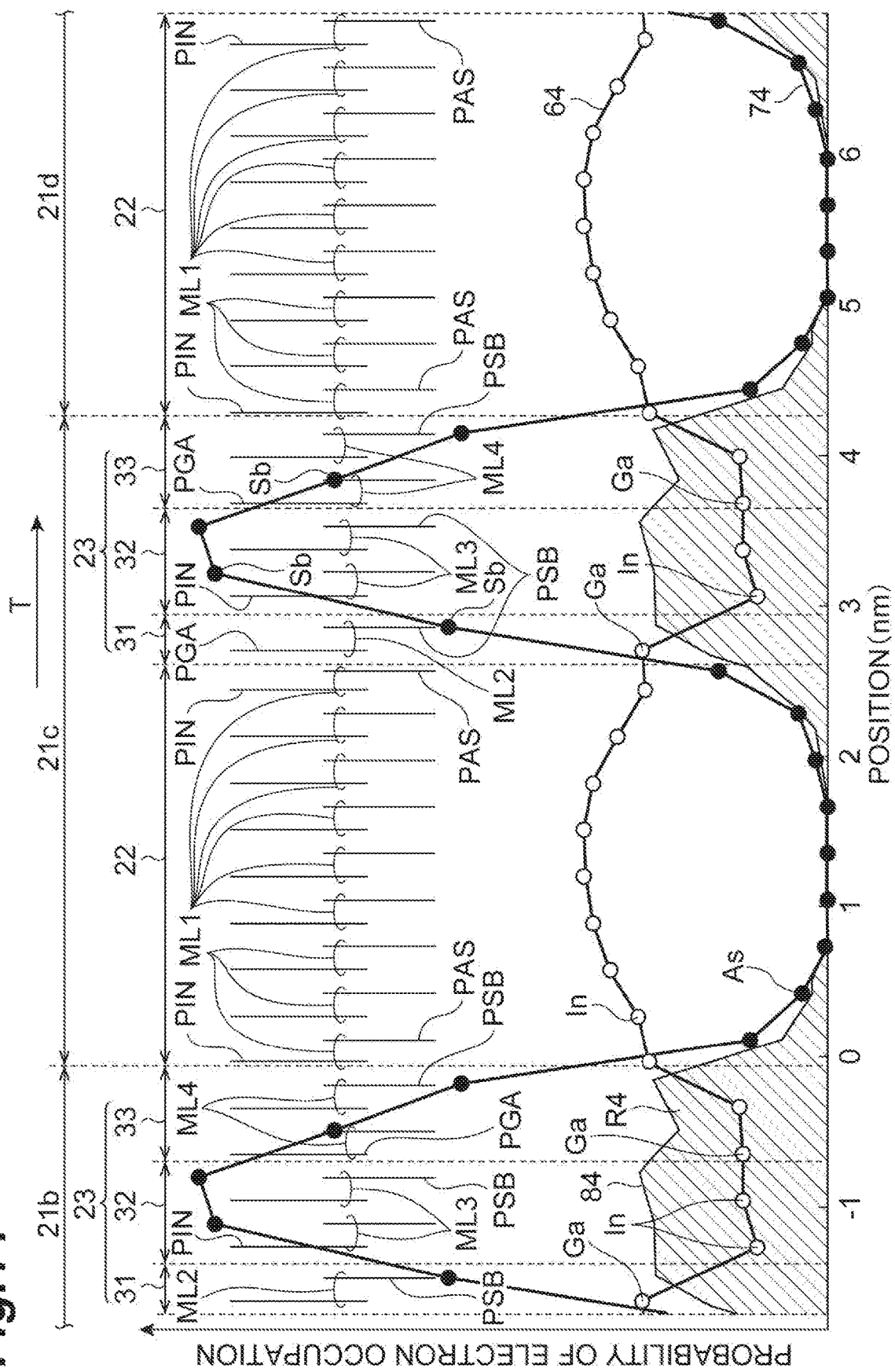
FIG. 14 is a view showing the array of molecular layers in the unit structure for the light-receiving layer according to the embodiment.
Figure 15:
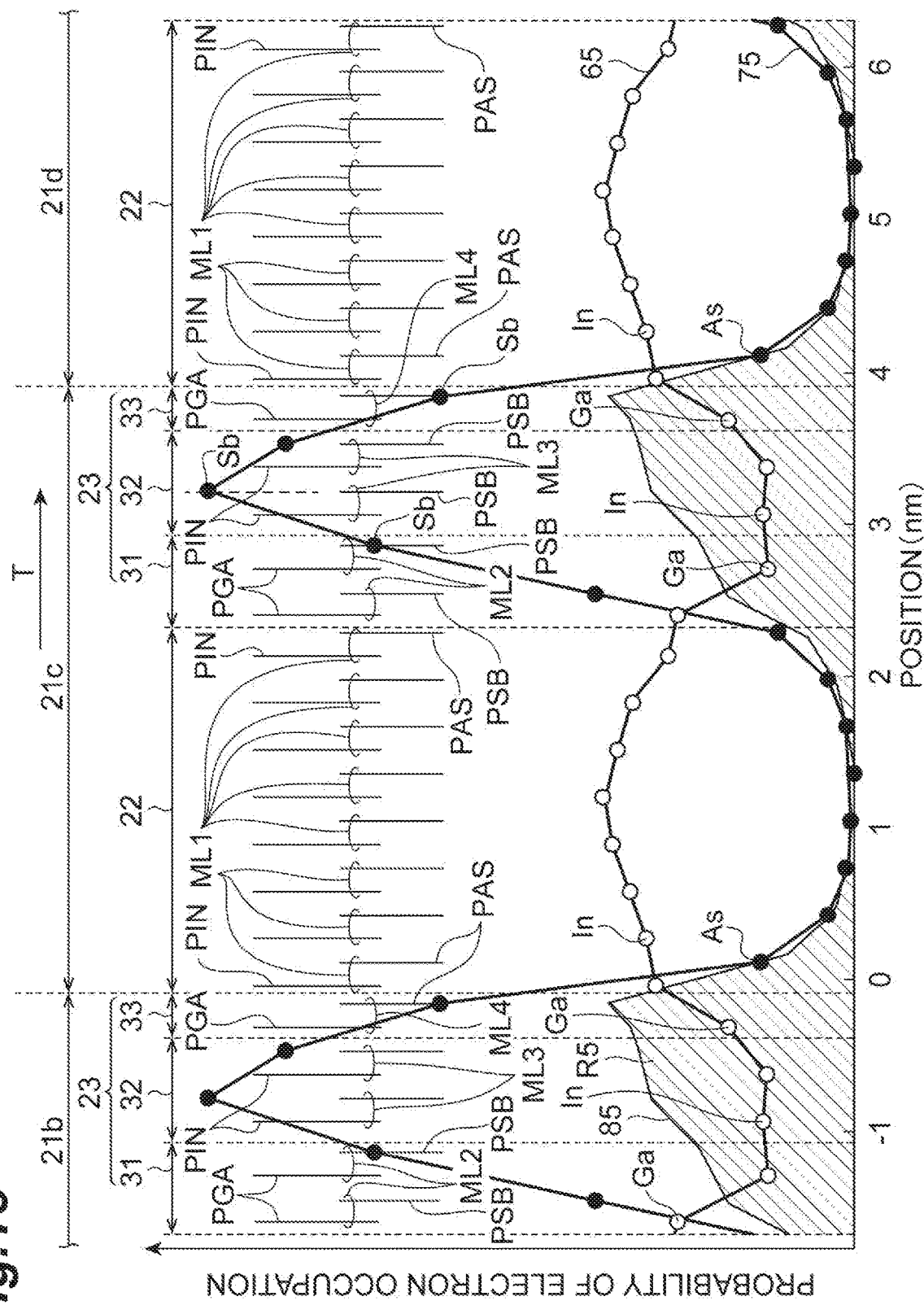
FIG. 15 is a view showing an array of molecular layers in the unit structure for the light-receiving layer according to the embodiment.

In the light receiving layer 5 of the semiconductor light receiving device 1, as shown in FIGS. 13, 14 and 15, each unit structure 21 (21A) has one or more first molecular layers M1L of InAs, one or more second molecular layers M2L of GaSb, one or more third molecular layers M3L of InSb, and one or more fourth molecular layers M4L of GaSb. The first molecular layers M1L, the second molecular layers M2L, the third molecular layers M3L, and the fourth molecular layers M4L are sequentially arranged in the direction of the device axis T.

Figure 16:
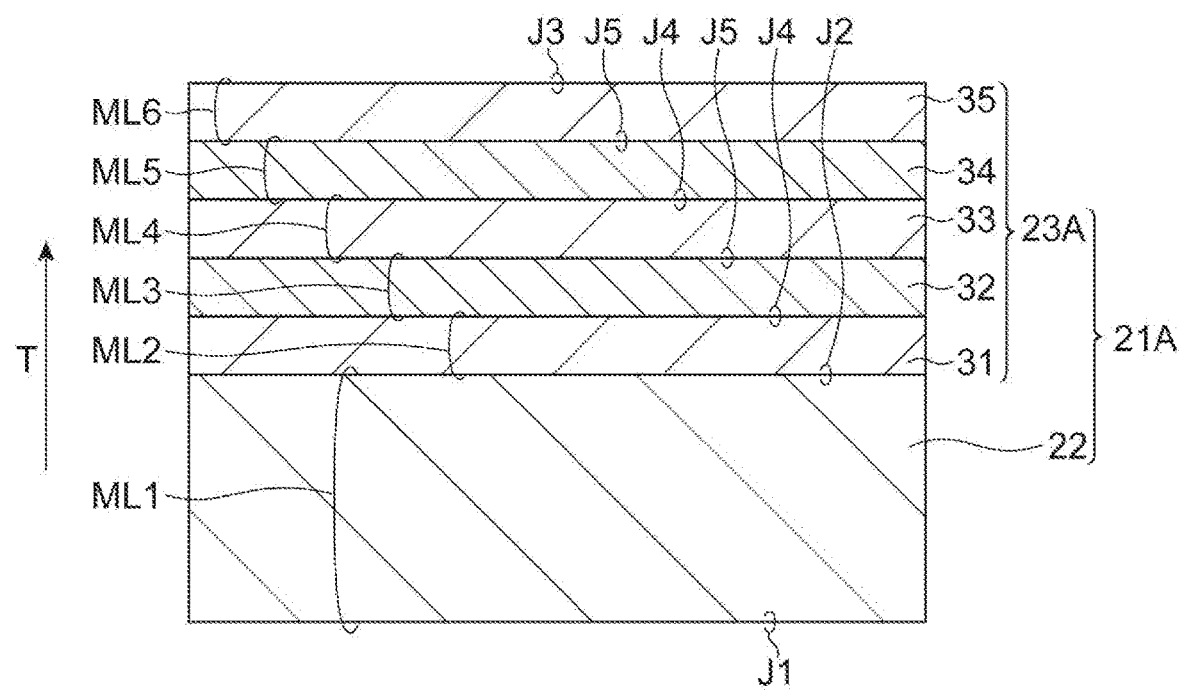
FIG. 16 is a view showing the array of molecular layers in the unit structure for the light-receiving layer according to the embodiment.

In the light receiving layer 5 of the semiconductor light receiving device 1, as shown in FIG. 16, each unit structure 21A includes one or more fifth molecular layers M5L of InSb, and one or more sixth molecular layer M6L of GaSb. The first molecular layers M1L, the second molecular layers M2L, the third molecular layers M3L, the fourth molecular layers M4L, the fifth molecular layers M5L, and the sixth molecular layers M6L are sequentially arranged in the direction of the device axis T.

Each of the first molecular layers MI of InAs includes a single In plane PIN and a single As plane PAS. Each of the second molecular layers M2L of GaSb, the fourth molecular layers M4L of GaSb, and the sixth molecular layers M6L of GaSb includes a single Ga plane PGA and a single Sb plane PSB. The third molecular layers M3L of InSb and the fifth molecular layer M5L of InSb each include a single In plane PIN and a single Sb plane PSB.

Figure 17:
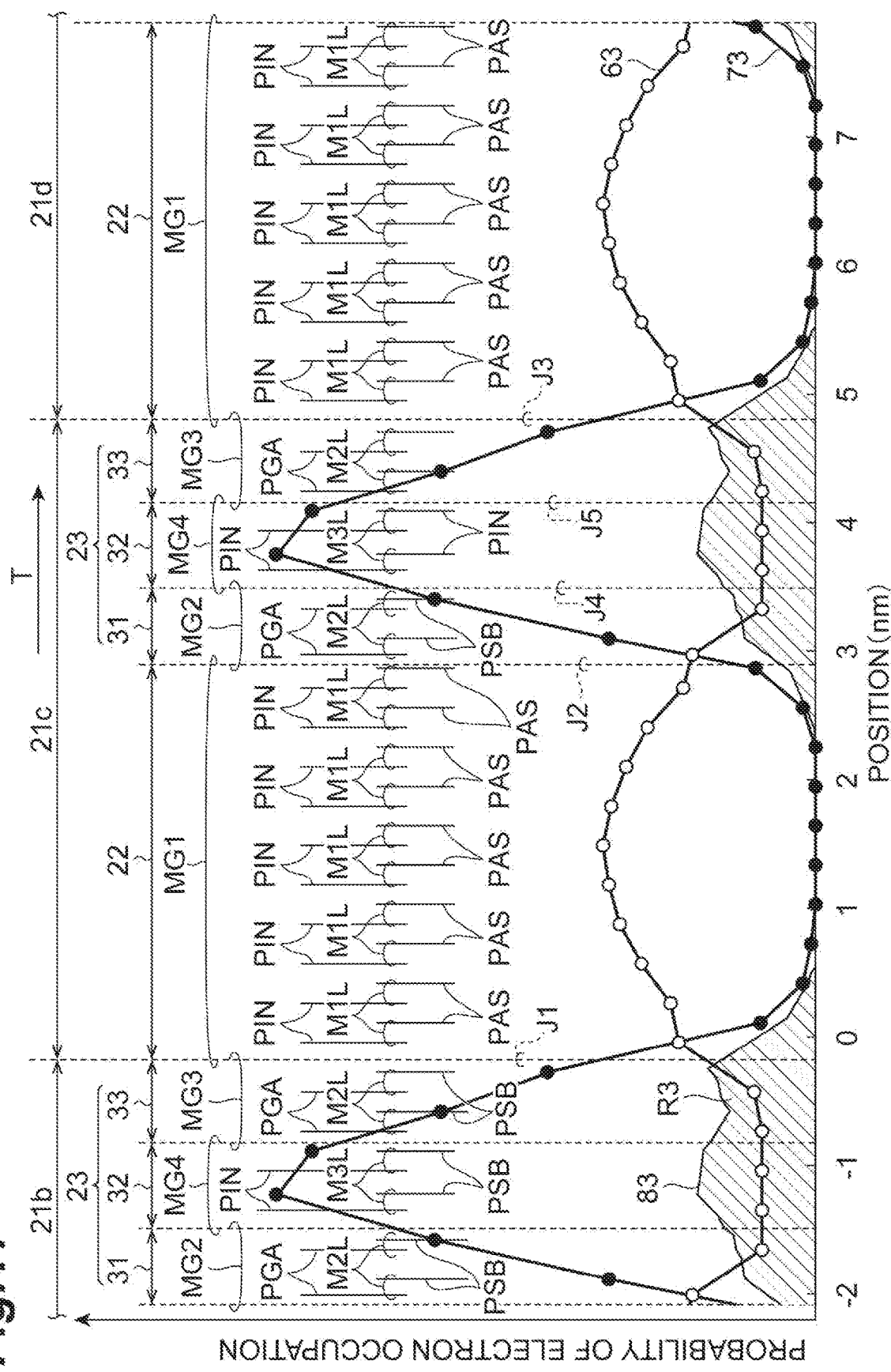
FIG. 17 is a view showing an array of groups each containing molecular layers in a unit structure for a light receiving layer according to the embodiment.
Figure 18:
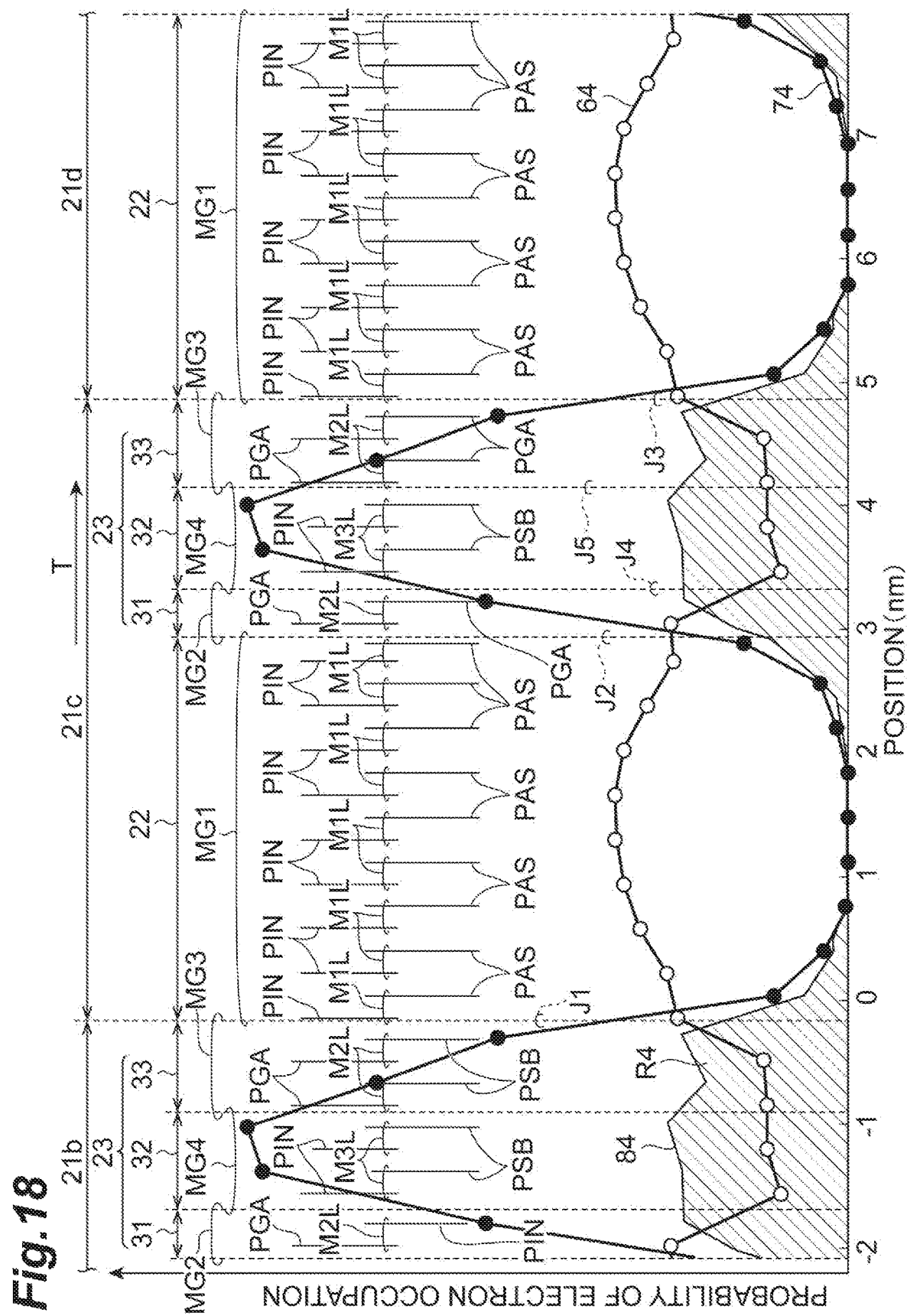
FIG. 18 is a view showing an array of groups each containing molecular layers in a unit structure for a light-receiving layer according to the embodiment.
Figure 19:
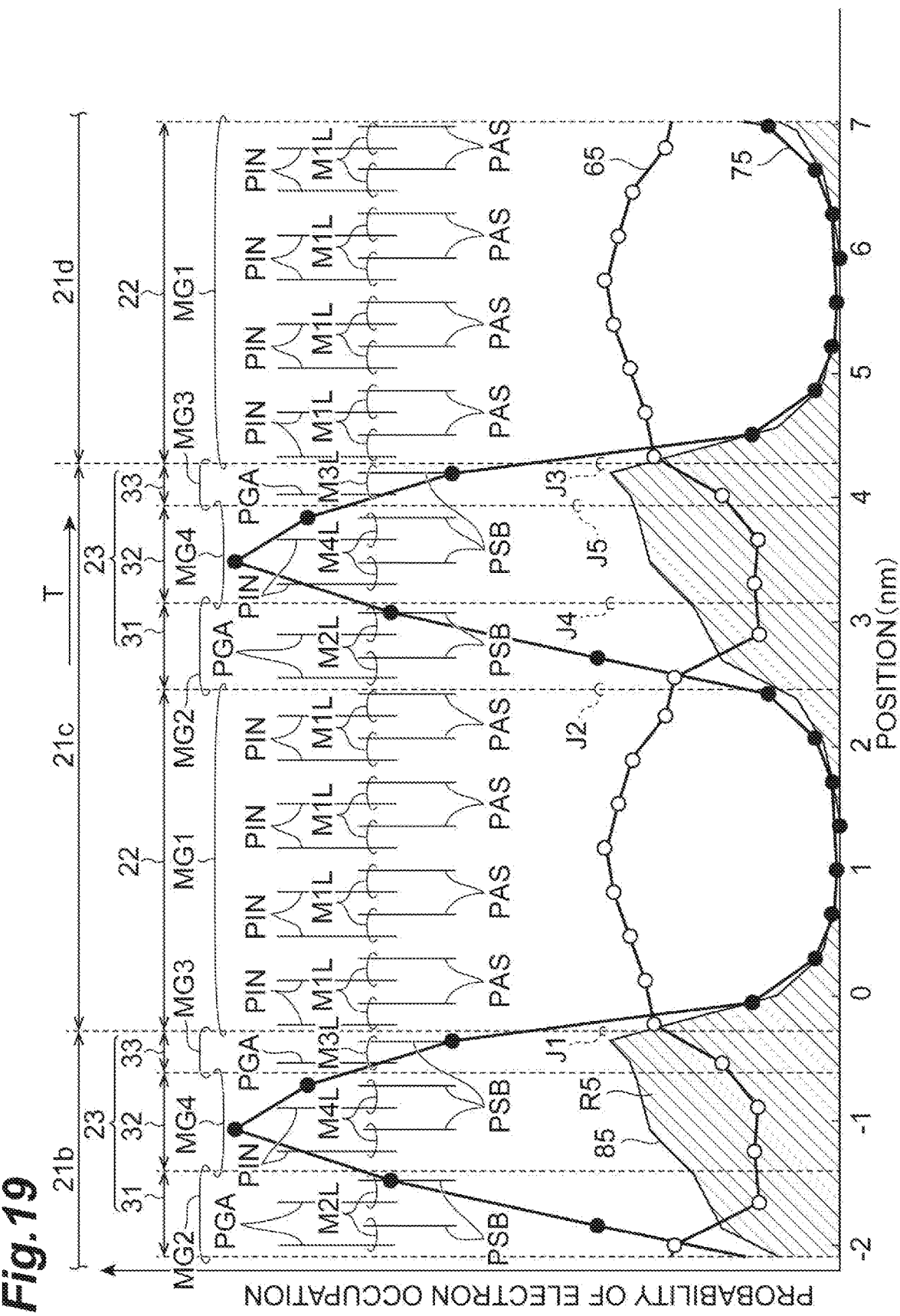
FIG. 19 is a view showing an array of groups each containing molecular layers in a unit structure for a light-receiving layer according to the embodiment.
Figure 20:
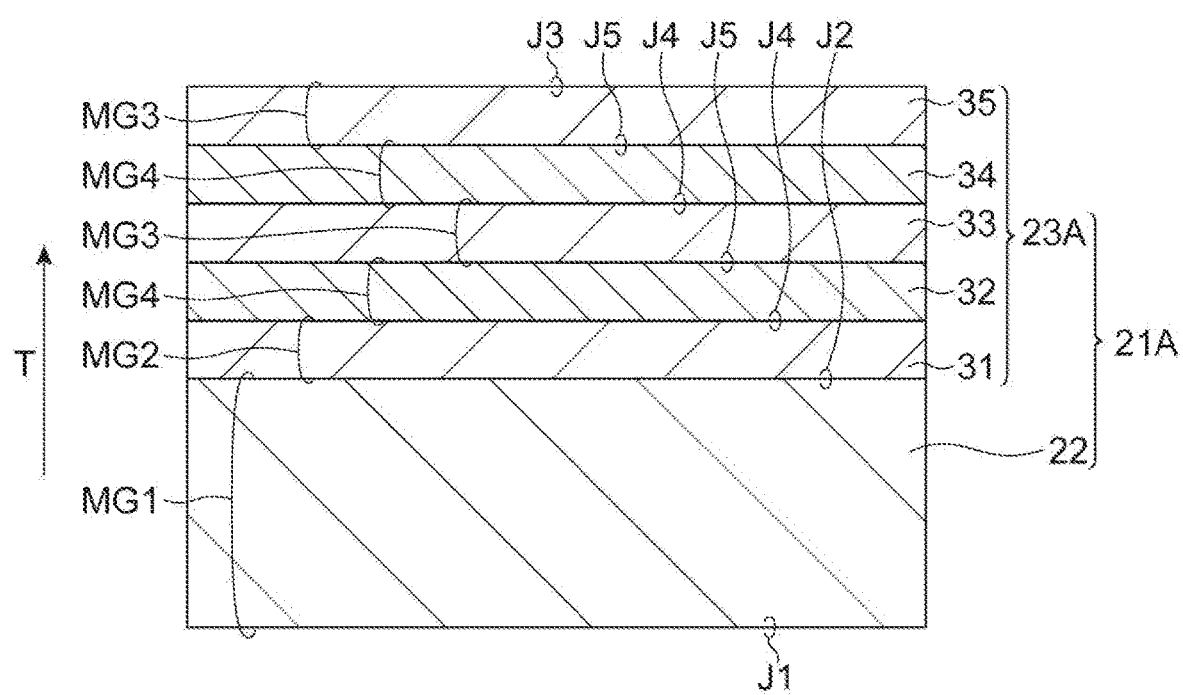
FIG. 20 is a view showing an array of groups each containing molecular layers in a unit structure for a light-receiving layer according to the embodiment.

In the light receiving layer 5 of the semiconductor light receiving device 1, as shown in FIGS. 17, 18 and 19, each of the unit structures 21 (21A) has a single first group M1G containing one or more first molecular layers MI of InAs, a single second group containing one or more second molecular layers M2L of GaSb, one or more third group MG3 containing one or more third molecular layers of GaSb, and one or more fourth groups M4G of the fourth molecular layers M4L of InSb. The first group M1G includes a single InAs molecular layer or multiple InAs molecular layers arranged in series. The second group M2G includes a single GaSb molecular layer or multiple GaSb molecular layers sequentially arranged. Each of the third groups M3G includes a single GaSb molecular layer or multiple GaSb molecular layers sequentially arranged. Each of the fourth groups M4G includes a single InSb molecular layer or multiple InSb molecular layers sequentially arranged.

As shown in FIGS. 17, 18, 19 and 20, in each unit structure 21 (21A), any of the third groups M3G of GaSb is between the second group M2G of GaSb and one of the fourth groups M4G of InSb. The second group M2G of GaSb is between the first group M1G of InAs and all of the third groups M3G of GaSb. Any of the fourth groups M4G of InSb is between any two of the third groups M3G of GaSb.

An exemplary unit structure 21 (21A) includes an arrangement of the first group M1G, the second group M2G of GaSb, the single fourth group M4G of InSb, and the single third group M3G of GaSb, and the first group M1G of InAs, the second group M2G of GaSb, the single fourth group M4G of InSb, the single third group M3G of GaSb, the single fourth group M4G of InSb, and the single third group M3G of GaSb.

As described above, the present embodiment provides a semiconductor photodetector enabling both stability in device characteristics and improvement in light receiving sensitivity to long-wavelength infrared rays.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A light receiving device comprising:
   a first conductivity-type III-V compound semiconductor layer;
   a second conductivity-type III-V compound semiconductor layer; and
   a light absorbing layer disposed between the first conductivity-type III-V compound semiconductor layer and the second conductivity-type III-V compound semiconductor layer, the light absorbing layer including multiple unit structures arranged in a direction of an axis to form a type-II superlattice,
   each unit structure having an InAs portion, a first GaSb portion, an InSb portion, and a second GaSb portion arranged in the direction of the axis,
   the InAs portion having multiple InAs molecular layers arranged in the direction of the axis,
   the first GaSb portion having a GaSb molecular layer, the first GaSb portion having a group-III atomic plane and a group-V atomic plane, the InAs portion having a group-III atomic plane and a group-V atomic plane, one of the group-III atomic plane and the group-V atomic plane in the first GaSb portion being bonded to one of the group-III atomic plane and the group-V atomic plane in the InAs portion,
   the InSb portion having an InSb molecular layer, the InSb portion having a group-III atomic plane and a group-V atomic plane, one of the group-III atomic plane and the group-V atomic plane in the InSb portion being bonded to the other of the group-III atomic plane and the group-V atomic plane in the first GaSb portion, and
   the second GaSb portion having a GaSb molecular layer, the second GaSb portion having a group-III atomic plane and a group-V atomic plane, one of the group-III atomic plane and the group-V atomic plane in the second GaSb portion being bonded to the other of the group-III atomic plane and the group-V atomic plane in the InSb portion.

2. The light receiving device according to claim 1, wherein
   the first GaSb portion has a group-V atomic plane bonded to a group-III atomic plane of the InAs portion,
   the InSb portion has a group-V atomic plane bonded to a group-III atomic plane of the first GaSb portion, and
   the second GaSb portion has a group-V atomic plane bonded to a group-III atomic plane of the InSb portion.

3. The light receiving device according to claim 1, wherein
   the first GaSb portion has a group-III atomic plane bonded to a group-V atomic plane of the InAs portion,
   the InSb portion has a group-III atomic plane bonded to a group-V atomic plane of the first GaSb portion, and
   the second GaSb portion has a group-III atomic plane bonded to a group-V atomic plane of the InSb portion.

4. The light receiving device according to claim 1, wherein the first GaSb portion has a number of group-III atomic layers different from that of the second GaSb portion.

5. The light receiving device according to claim 1, wherein the first GaSb portion has the same number of group-III atomic layers as that of the second GaSb portion.

* * * * *